US012598801B2

(12) United States Patent
Chung et al.

(10) Patent No.: US 12,598,801 B2
(45) Date of Patent: Apr. 7, 2026

(54) SEMICONDUCTOR DEVICE OF PHYSICAL UNCLONABLE FUNCTION AND MANUFACTURING METHOD THEREOF

(71) Applicant: TAIWAN SEMICONDUCTOR MANUFACTURING COMPANY, LTD., Hsinchu (TW)

(72) Inventors: Chia-Che Chung, Hsinchu City (TW); Wei Min Chan, New Taipei City (TW); Yen-Huei Chen, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 374 days.

(21) Appl. No.: 18/317,210

(22) Filed: May 15, 2023

(65) Prior Publication Data

US 2024/0387524 A1 Nov. 21, 2024

(51) Int. Cl.
| | |
|---|---|
| *H10D 84/83* | (2025.01) |
| *H01L 23/522* | (2006.01) |
| *H01L 23/528* | (2006.01) |
| *H10D 30/01* | (2025.01) |
| *H10D 62/13* | (2025.01) |

(52) U.S. Cl.
CPC ......... *H10D 84/83* (2025.01); *H01L 23/5226* (2013.01); *H01L 23/528* (2013.01); *H10D 30/021* (2025.01); *H10D 62/151* (2025.01)

(58) Field of Classification Search
CPC .... H10D 84/83; H10D 30/021; H10D 62/151; H01L 23/5226; H01L 23/528
See application file for complete search history.

(56) References Cited

U.S. PATENT DOCUMENTS

| | | | | |
|---|---|---|---|---|
| 9,666,582 | B1 * | 5/2017 | Li | .............. G09C 1/00 |
| 10,020,268 | B2 * | 7/2018 | Wong | ..................... H10B 41/41 |

(Continued)

OTHER PUBLICATIONS

Y. Xiao et al., "Novel Concept of the Transistor Variation Directed Toward the Circuit Implementation of Physical Unclonable Function (PUF) and True-random-number Generator (TRNG)," 2019 IEEE International Electron Devices Meeting (IEDM), 2019, pp. 21.5.1-21.5.4.

(Continued)

*Primary Examiner* — Caleb E Henry
(74) *Attorney, Agent, or Firm* — Maschofff Brennan

(57) ABSTRACT

A semiconductor device includes a first transistor cell. The first transistor cell generates a first current signal and a second current signal indicating a bit of a physical unclonable function. The first transistor cell includes a first transistor, a second transistor and a third transistor. The first transistor outputs the first current signal. The second transistor generates the first current signal from a first source/drain structure of the second transistor, and generates the second current signal from a second source/drain structure of the second transistor. The third transistor outputs the second current signal. The first transistor, the second transistor and the third transistor are stacked in order along a first direction. The first source/drain structure of the second transistor and the second source/drain structure of the second transistor are arranged along a second direction different from the first direction.

20 Claims, 16 Drawing Sheets

(56) References Cited

U.S. PATENT DOCUMENTS

| | | | | |
|---|---|---|---|---|
| 10,886,415 B2 * | 1/2021 | Lee | | H10D 64/017 |
| 10,910,369 B2 * | 2/2021 | Cheng | | H10D 84/83 |
| 11,044,108 B1 * | 6/2021 | Aronson | | H04L 9/0866 |
| 11,108,572 B2 * | 8/2021 | Lu | | G11C 11/419 |
| 11,239,414 B2 * | 2/2022 | Xie | | H10N 50/01 |
| 11,282,799 B2 * | 3/2022 | Wang | | H01L 21/76883 |
| 11,290,289 B2 * | 3/2022 | Shen | | H03K 5/13 |
| 11,309,247 B2 * | 4/2022 | Peng | | H10D 84/834 |
| 11,462,631 B2 * | 10/2022 | Cheng | | H10D 62/121 |
| 11,476,363 B2 * | 10/2022 | Verma | | H10D 30/023 |
| 11,507,703 B2 * | 11/2022 | Das | | H03K 17/687 |
| 2014/0327469 A1 * | 11/2014 | Pfeiffer | | H03K 19/003 |
| | | | | 326/8 |
| 2015/0028847 A1 * | 1/2015 | Vanhoucke | | G01R 31/2836 |
| | | | | 324/72 |
| 2015/0235964 A1 * | 8/2015 | Feng | | H01L 21/32139 |
| | | | | 257/786 |
| 2017/0092601 A1 * | 3/2017 | Okagaki | | H04L 9/3278 |
| 2018/0013431 A1 * | 1/2018 | Bury | | H01L 21/326 |
| 2018/0253568 A1 * | 9/2018 | Cheng | | H01L 23/576 |
| 2019/0190725 A1 * | 6/2019 | De | | G09C 1/00 |
| 2019/0199525 A1 * | 6/2019 | Mondello | | H04L 9/3242 |
| 2020/0035687 A1 * | 1/2020 | Horiuchi | | G11C 11/418 |
| 2020/0058660 A1 * | 2/2020 | Chang | | H01L 23/528 |
| 2020/0118995 A1 * | 4/2020 | Wang | | H01L 21/76877 |
| 2020/0145008 A1 * | 5/2020 | Strukov | | G11C 16/0425 |
| 2021/0083886 A1 * | 3/2021 | Lee | | H03K 19/17768 |
| 2021/0098500 A1 * | 4/2021 | Wang | | H10D 88/00 |
| 2021/0149636 A1 * | 5/2021 | Lin | | H10B 41/35 |
| 2021/0224041 A1 * | 7/2021 | Tseng | | G06F 1/10 |
| 2021/0265217 A1 * | 8/2021 | Peng | | H10D 30/605 |
| 2021/0391383 A1 * | 12/2021 | Lee | | H10B 61/20 |
| 2022/0328505 A1 * | 10/2022 | Chang | | H01L 23/528 |
| 2022/0391177 A1 * | 12/2022 | Elzbieciak | | G06F 8/34 |
| 2022/0399056 A1 * | 12/2022 | Park | | G06F 21/79 |
| 2023/0092828 A1 * | 3/2023 | Wang | | H03K 19/17768 |
| | | | | 326/8 |
| 2023/0137806 A1 * | 5/2023 | Huang | | H10D 89/10 |
| | | | | 257/369 |
| 2023/0154525 A1 * | 5/2023 | Kim | | G11C 16/22 |
| | | | | 365/185.04 |
| 2023/0262969 A1 * | 8/2023 | Yuh | | G11C 17/16 |
| | | | | 365/96 |
| 2023/0343789 A1 * | 10/2023 | Kao | | H10B 10/18 |
| 2023/0345690 A1 * | 10/2023 | Xie | | H10B 10/12 |
| 2023/0378288 A1 * | 11/2023 | Peng | | H10D 30/6757 |
| 2023/0386997 A1 * | 11/2023 | Lu | | H01L 23/5286 |
| 2023/0402379 A1 * | 12/2023 | Li | | H01L 21/76898 |
| 2024/0021519 A1 * | 1/2024 | Kim | | H01L 23/5283 |
| 2024/0305481 A1 * | 9/2024 | Lu | | H10D 84/038 |
| 2024/0387524 A1 * | 11/2024 | Chung | | H10D 62/151 |

OTHER PUBLICATIONS

Chia-Che Chung et al., "Architecture and Optimization of 2T (Footprint) SRAM", IEEE Transactions on Electron Devices, vol. 68, No. 10, Oct. 2021, pp. 4918-4924.

* cited by examiner

300

310

BL31

L33    L32    L31

SD35
SP33
G33
CN33
GX33

BD32

SP32
GX32
SD34

IS31
SP31
GX31
SD31

BB31

SD36

IS32

G32
CN32
SD33
BD31

G31
CN31
SD32

SB3

313

312

311

300
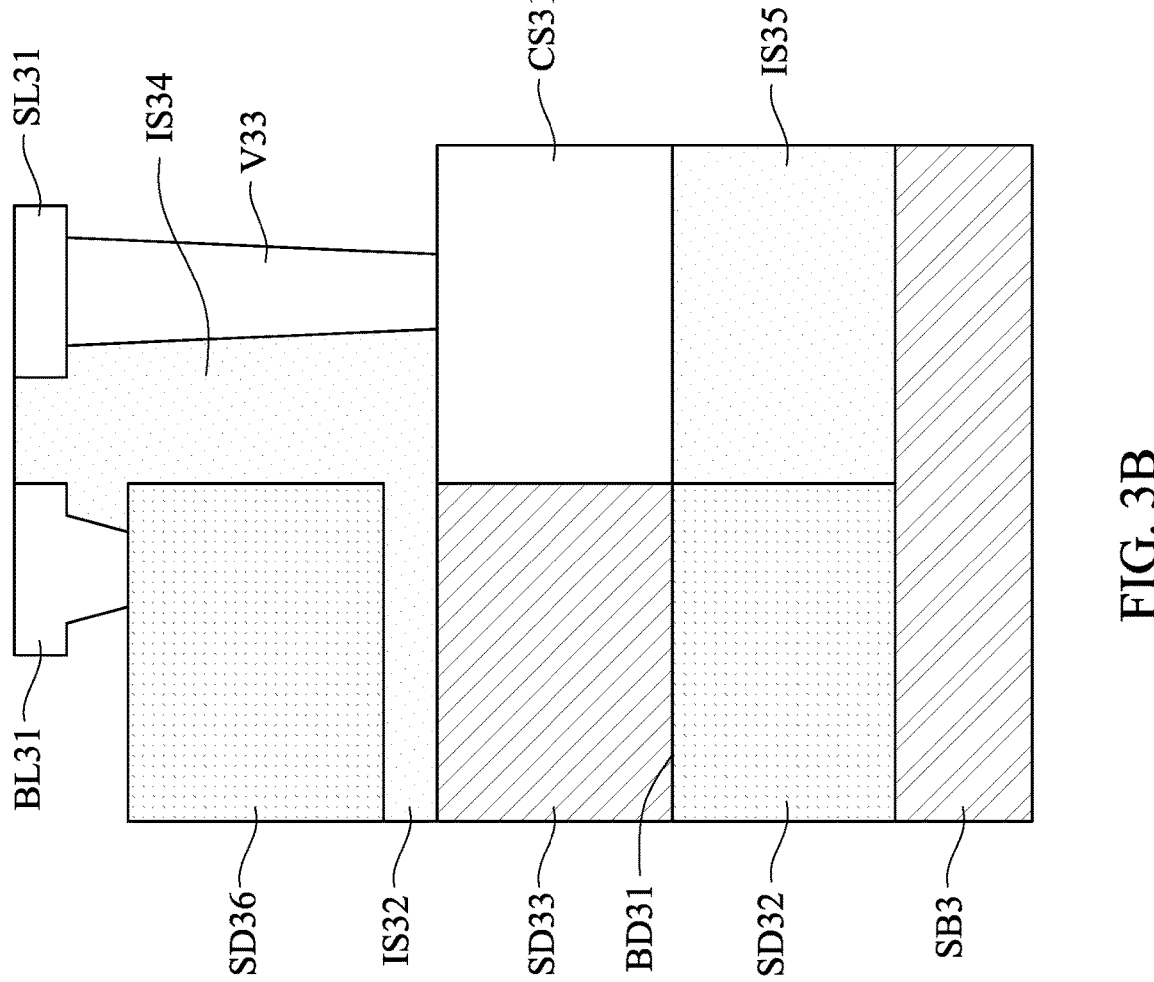
FIG. 3B
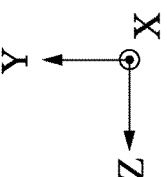

300

300
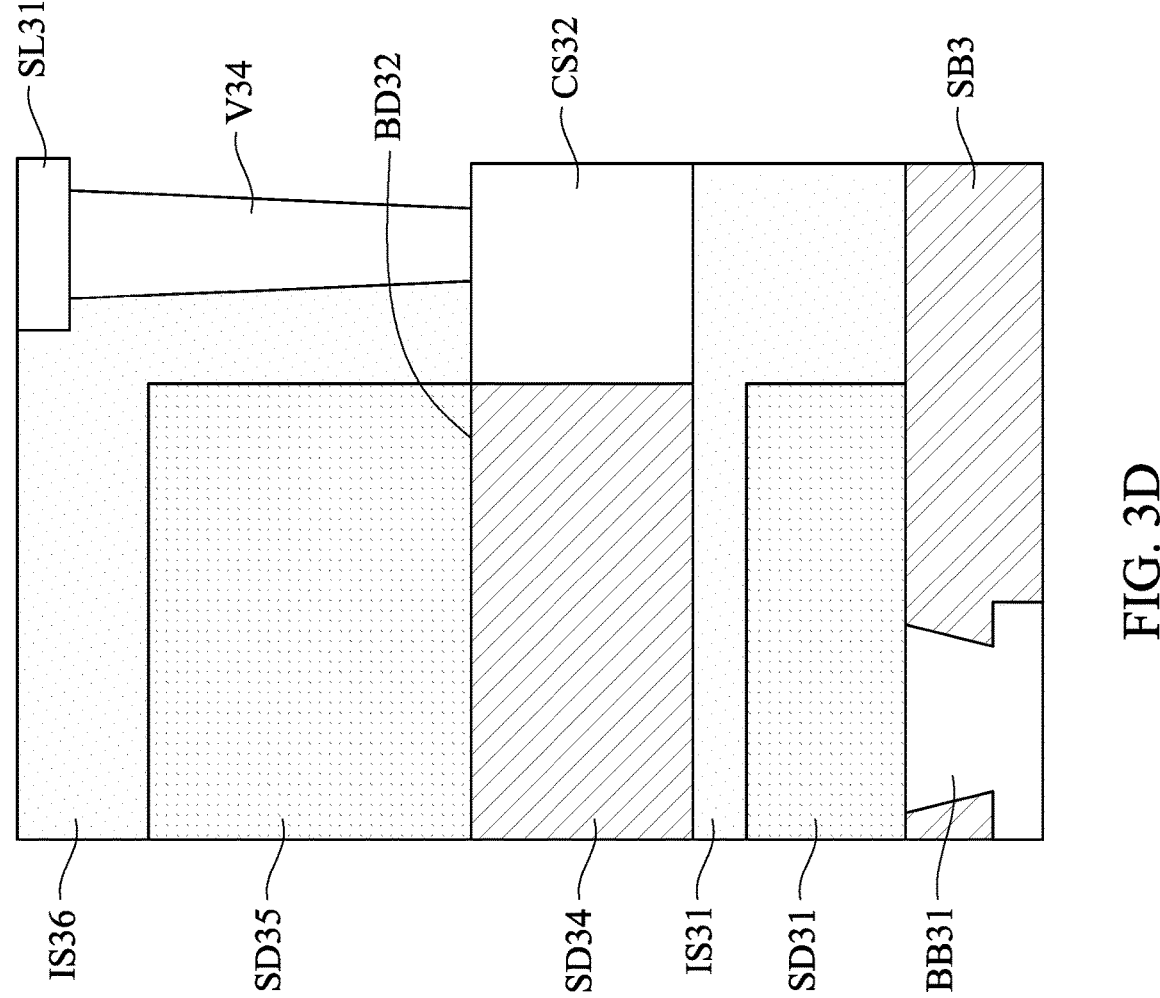
SL31
V34
BD32
CS32
SB3
IS36
SD35
SD34
IS31
SD31
BB31
FIG. 3D
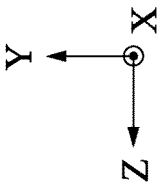
Y X
Z

600

X
Y
Z

600

SL31

IS34

V33

BL31

SD36

IS62

SD33

IS61

CS61

SD32

SB3

CS31

IS35

IS61

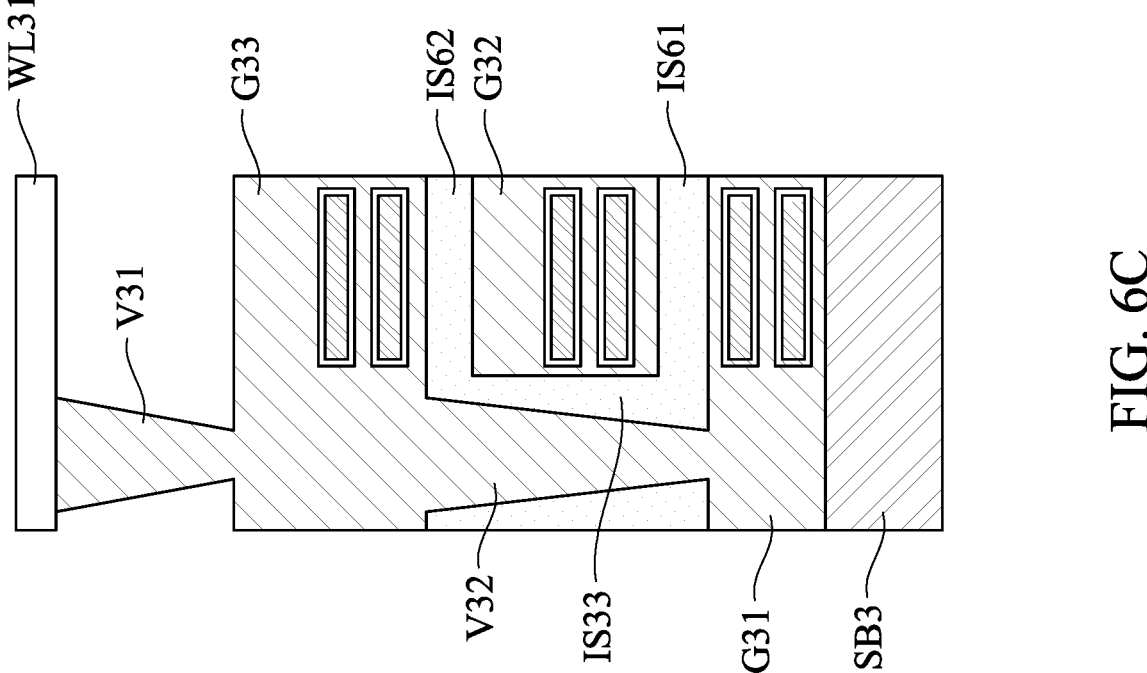
600
FIG. 6C
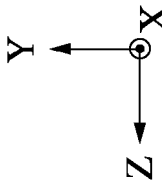

600
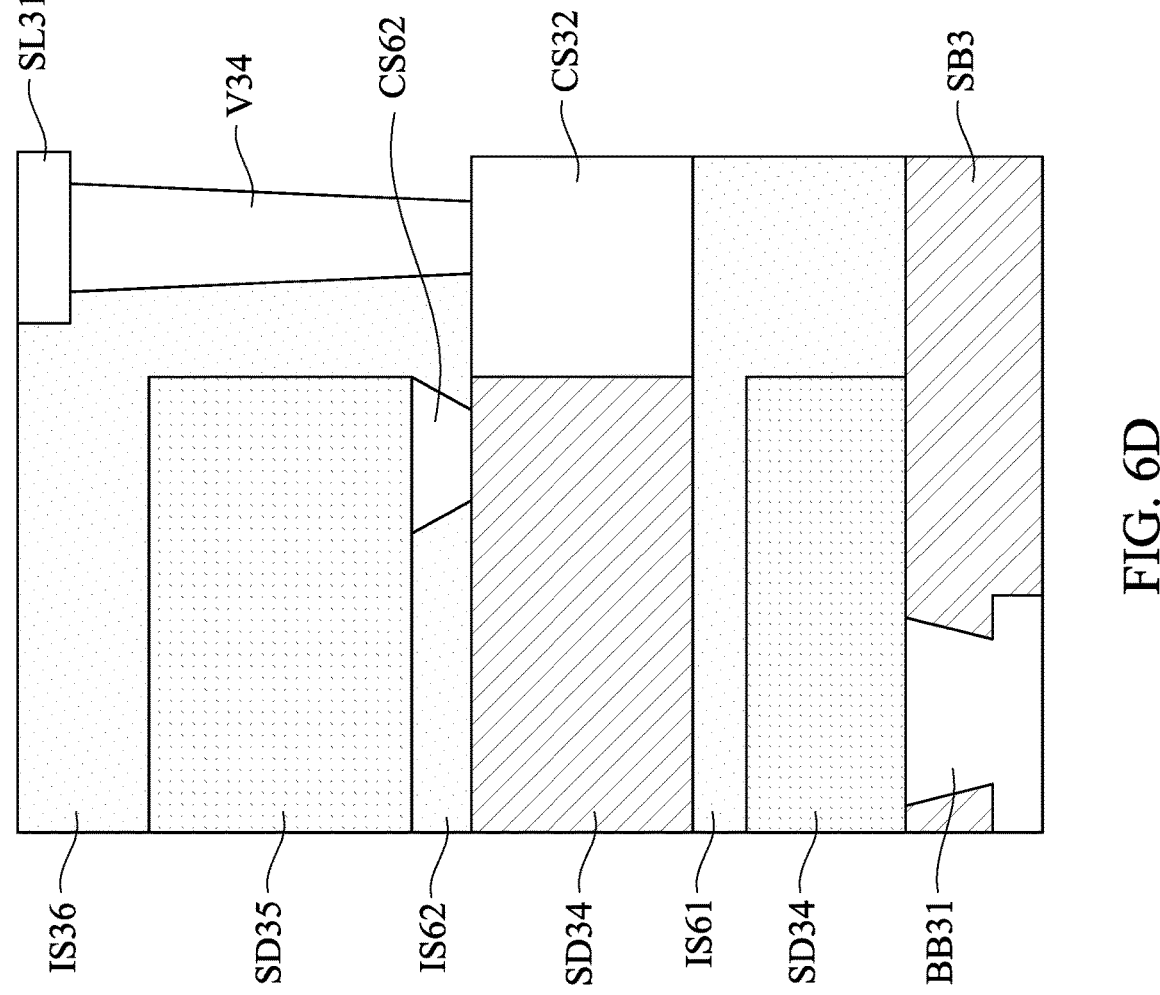
SL31
V34
CS62
CS32
SB3
IS36
SD35
IS62
SD34
IS61
SD34
BB31
FIG. 6D
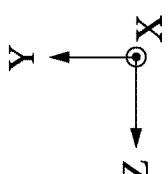
Y
X
Z

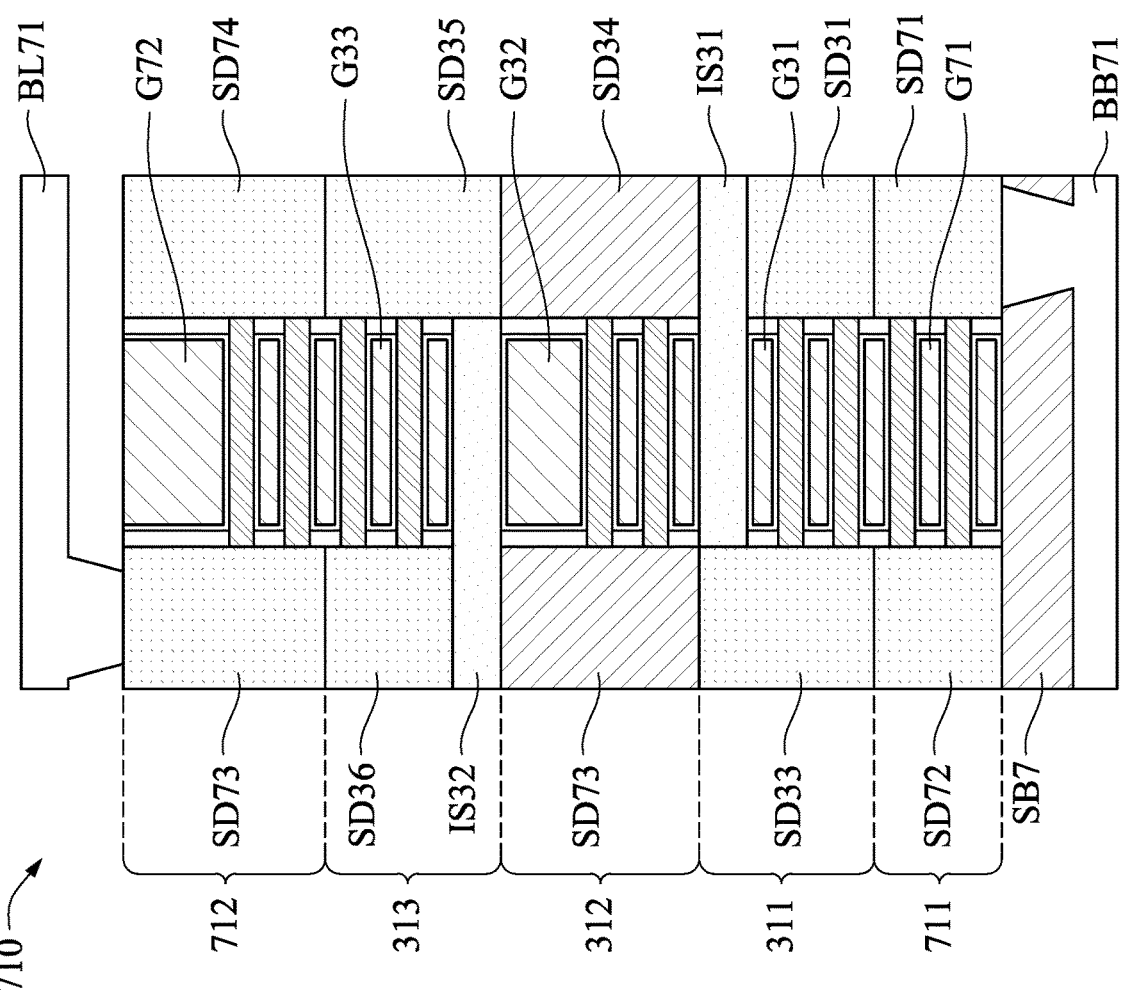
FIG. 7
700
710
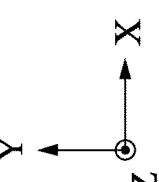
Y
X
Z

SEMICONDUCTOR DEVICE OF PHYSICAL UNCLONABLE FUNCTION AND MANUFACTURING METHOD THEREOF

BACKGROUND

A physical unclonable function is used as an identifier of a semiconductor device. The physical unclonable function is most often based on unique physical variations which occur naturally during semiconductor manufacturing. The physical unclonable function is a physical entity embodied in a physical structure, such as a memory system. Today, physical unclonable functions are usually implemented in integrated circuits and are typically used in applications with high security requirements, including, for example, cryptography.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3B is a cross section diagram of the semiconductor device along a line shown in FIG. 3A, in accordance with some embodiments of the present disclosure.

FIG. 3D is a cross section diagram of the semiconductor device 300 along a line shown in FIG. 3A, in accordance with some embodiments of the present disclosure.

FIG. 6C is a cross section diagram of the semiconductor device along a line shown in FIG. 6A, in accordance with some embodiments of the present disclosure.

FIG. 6D is a cross section diagram of the semiconductor device along a line shown in FIG. 6A, in accordance with some embodiments of the present disclosure.

FIG. 7 is a cross section diagram of a semiconductor device corresponding to the semiconductor device shown in FIG. 3A, in accordance with some embodiments of the present disclosure.

DETAILED DESCRIPTION

Figure 1:
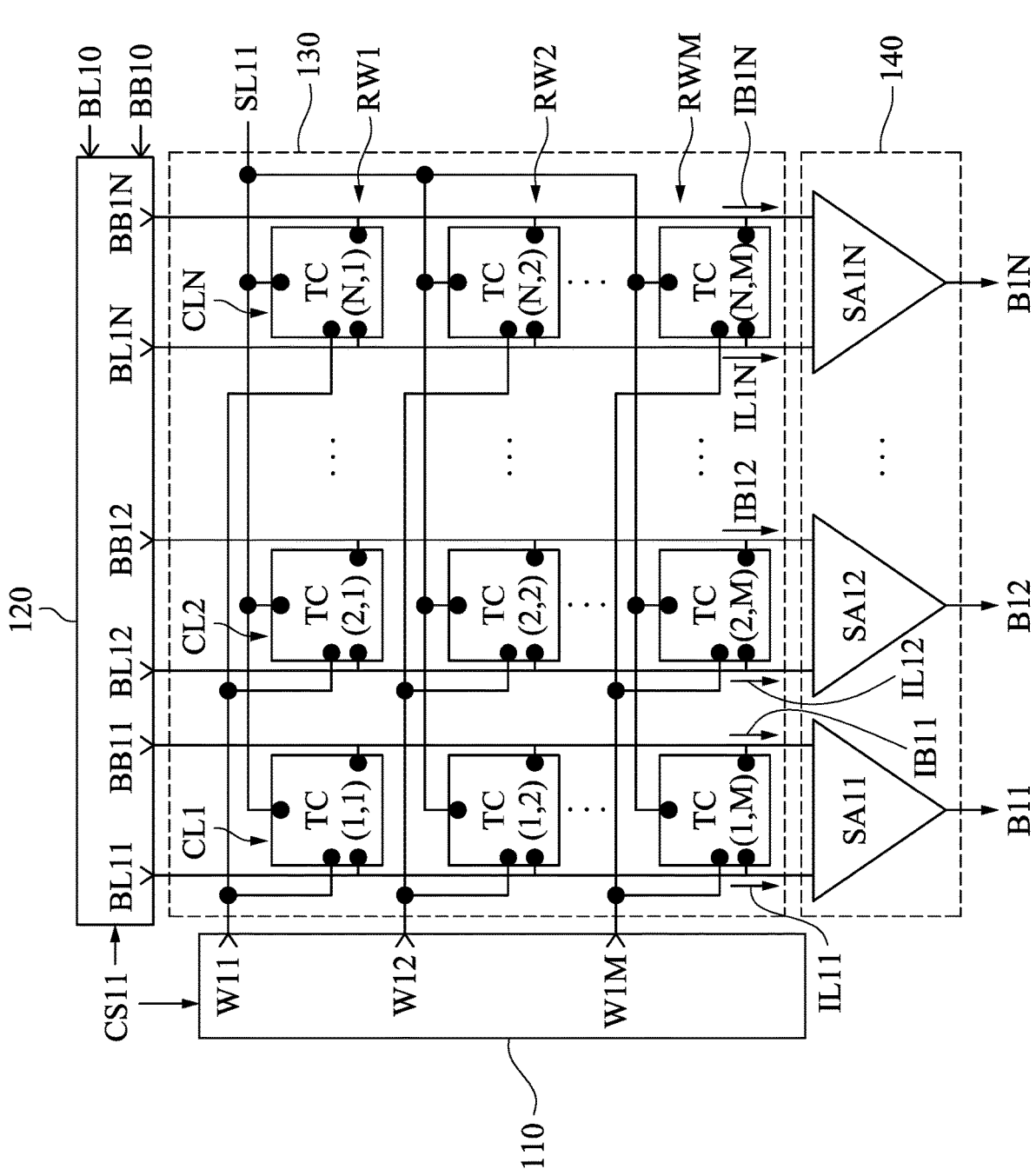
FIG. 1 is a schematic diagram of a semiconductor device, in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

FIG. 1 is a schematic diagram of a semiconductor device 100, in accordance with some embodiments of the present disclosure. In some embodiments, the semiconductor device 100 is configured to generate at least one of output bits B11-BIN of a physical unclonable function (PUF) according to a challenge signal CS11. It is noted that N is a positive integer. In some embodiments, the PUF is used as a random number generator, and indicates unique physical variations which occur naturally and randomly during semiconductor manufacturing. In some embodiments, the PUF is a physical entity embodied in the semiconductor device 100, and is able to be used in applications with high security requirements, including, for example, cryptography.

As illustratively shown in FIG. 1, the semiconductor device 100 includes a word line circuit 110, a bit line circuit 120, a transistor circuit 130 and an output circuit 140. In some embodiments, the word line circuit 110 is configured to generate word line signals WL1-WLM according to the challenge signal CS11. It is noted that M is a positive integer. The bit line circuit 120 is configured to generate bit line signals BL11-BLIN and BB11-BB1N according to the challenge signal CS11 and bit line signals BL10 and BB10.

In some embodiments, the transistor circuit 130 is configured to generate current signals IL11-IL1N and IB11-IB1N according to the word line signals WL1-WLM, the bit line signals BL11-BLIN, BB11-BB1N and a voltage signal SL11. The output circuit 140 is configured to generate output bits B11-BIN according to the current signals IL11-IL1N and IB11-IB1N.

As illustratively shown in FIG. 1, the transistor circuit 130 includes transistor cells TC(1, 1)-TC(N, M). Each of the transistor cells TC(1, 1)-TC(N, M) is configured to have a logic value of 0 or 1. The logic values of the transistor cells TC(1, 1)-TC(N, M) are randomly distributed according to variations of a manufacturing process of the transistor circuit 130. In some embodiments, the transistor cells TC(1, 1)-TC(N, M) are referred to as PUF cells for generating random logic values.

As illustratively shown in FIG. 1, the transistor cells TC(1, 1)-TC(N, M) are arranged in columns CL1-CLN and rows RW1-RWM. For example, the transistor cells TC(1, 1)-TC(1, M) are included in the column CL1. The transistor cells TC(N, 1)-TC(N, M) are included in the column CLN. The transistor cells TC(1, 1)-TC(N, 1) are included in the row RW1. The transistor cells TC(1, M)-TC(N, M) are included in the row RWM.

In some embodiments, the rows RW1-RWM are configured to receive the word line signals WL1-WLM, respectively. The columns CL1-CLN are configured to receive the bit line signals BL11-BLIN, respectively, and are configured to receive the bit line signals BB11-BB1N, respectively. Each of the columns CL1-CLN is configured to generate corresponding two of the current signals IL11-IL1N and IB11-IB1N.

In some embodiments, one or more of the columns CL1-CLN is selected by the challenge signal CS11. The bit line circuit 120 is configured to adjust one or more of the bit line signals BL11-BLIN to a voltage level of the bit line signal BL10, and is configured to adjust one or more of the bit line signals BB11-BB1N to a voltage level of the bit line signal BB10, according to the selected one or more of the columns CL1-CLN. In some embodiments, the voltage levels of the bit line signals BL10 and BB10 are the same. In some embodiments, the bit line circuit 120 is implemented as a multiplexer.

As illustratively shown in FIG. 1, the output circuit 140 includes comparators SA11-SA1N. Each of the comparators SA11-SA1N is configured to compare voltage levels of corresponding two of the current signals IL11-IL1N and IB11-IB1N, to output a corresponding one of the output bits B11-BIN according to the comparison result. In some embodiments, each of the comparators SA11-SA1N is implemented by a sensing amplifier.

In some embodiments, the challenge signal CS11 indicates an address of one of the transistor cells TC(1, 1)-TC(N, M). The word line circuit 110 and the bit line circuit 120 activates the one of the transistor cells TC(1, 1)-TC(N, M), such that the one of the transistor cells TC(1, 1)-TC(N, M) generates corresponding two of the current signals IL11-IL1N and IB11-IB1N. The output circuit 140 outputs a corresponding one of the output bits B11-BIN according to the logic value of the one of the transistor cells TC(1, 1)-TC(N, M).

For example, when the challenge signal CS11 indicates the first row RWM and the first column CLN, the word line circuit 110 generates the word line signal W1M, and the bit line circuit 120 generates the bit line signals BLIN and BB1N, such that the bit line signals BLIN and BB1N has the voltage levels of the bit line signals BL10 and BB10, respectively. Accordingly, the transistor cell TC(N, M) is activated to generate the current signals IL1N and IB1N according to the logic value of the transistor cell TC(N, M), and the comparator SA1N compares current levels of the current signals IL1N and IB1N to generate the output bit BIN.

In various embodiments, in response to the challenge signal CS11, one or more of the output bits B11-BIN is referred to as a PUF output. A value of the PUF output is random in response to the variations of the manufacturing process of the transistor circuit 130 being random. The PUF output is used for applications requiring random values.

Figure 2:
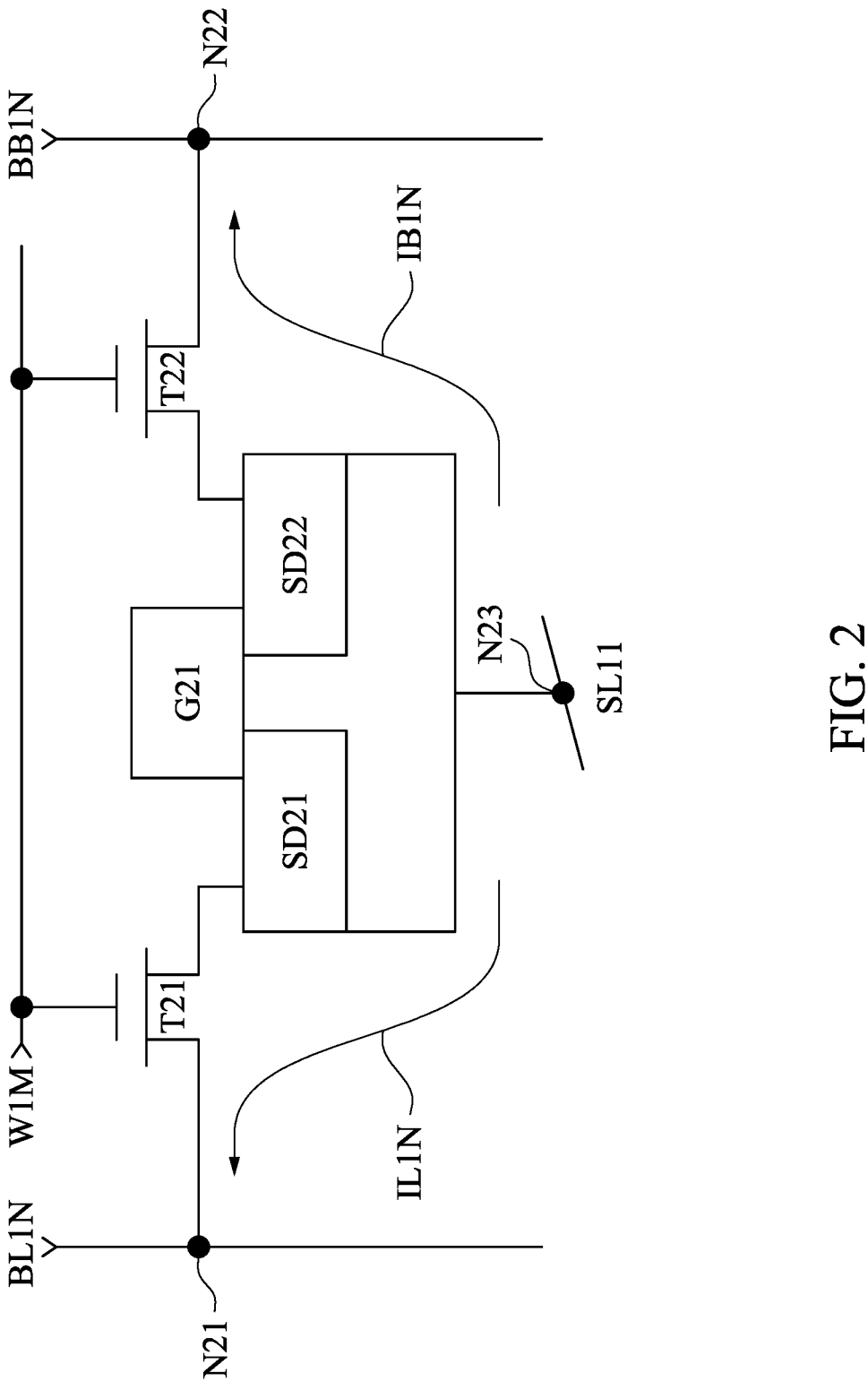
FIG. 2 is a schematic diagram of a transistor cell corresponding to the transistor cell shown in FIG. 1, in accordance with some embodiments of the present disclosure.

FIG. 2 is a schematic diagram of a transistor cell 200 corresponding to the transistor cell TC(N, M) shown in FIG. 1, in accordance with some embodiments of the present disclosure. Referring to FIG. 2 and FIG. 1, the transistor cell 200 is an embodiment of the transistor cell TC(N, M). In some embodiments, each of the transistor cells TC(1, 1)-TC(N, M) has a configuration similar with the transistor cell 200.

As illustratively shown in FIG. 2, the transistor cell 200 includes transistors T21, T22, a gate structure G21 and source/drain structures SD21 and SD22. In some embodiments, the gate structure G21 and the source/drain structures SD21 and SD22 are formed as a transistor during a manufacturing process of transistors, such as field-effect transistors. The gate structure G21 and the source/drain structures SD21 and SD22 correspond to a gate, a source and a drain of the transistor, respectively.

As illustratively shown in FIG. 2, a terminal of the transistor T21 is configured to receive the bit line signal BLIN at a node N21, another terminal of the transistor T21 is coupled to the source/drain structure SD21, and a control terminal of the transistor T21 is configured to receive the word line signal W1M. A terminal of the transistor T22 is configured to receive the bit line signal BB1N at a node N22, another terminal of the transistor T22 is coupled to the source/drain structure SD22, and a control terminal of the transistor T22 is configured to receive the word line signal W1M. Each of the source/drain structures SD21 and SD22 is configured to receive the voltage signal SL11 at a node N23.

In some embodiments, the transistor T21 and the source/drain structure SD21 are configured to generate the current signal IL1N according to a voltage difference between the nodes N23 and N21 and a resistance between the nodes N23 and N21, which includes a resistance of the source/drain structure SD21. The current signal IL1N flows from the node N23 through the source/drain structure SD21 and the transistor T21 to the node N21. When the resistance of the source/drain structure SD21 is increased, a current level of the current signal IL1N is decreased.

Similarly, in some embodiments, the transistor T22 and the source/drain structure SD22 are configured to generate the current signal IB1N according to a voltage difference between the nodes N23 and N22 and a resistance between the nodes N23 and N22, which includes a resistance of the source/drain structure SD22. The current signal IB1N flows from the node N23 through the source/drain structure SD22 and the transistor T22 to the node N22. When the resistance of the source/drain structure SD22 is increased, a current level of the current signal IB1N is decreased.

In some embodiments, the transistors T21 and T22 operate as pass gates of the current signals IL1N and IB1N, respectively. Accordingly, the transistors T21 and T22 are referred to as pass gate transistors.

In some embodiments, the resistances of the source/drain structures SD21 and SD22 are affected by the variations, such as doping variations, during the manufacturing process of the source/drain structures SD21 and SD22. In response to randomness of the variations, the resistances of the source/drain structures SD21 and SD22 are randomly distributed. In some embodiments, the resistance of the source/drain structure SD21 is larger than the resistance of the source/drain structure SD22. In other embodiments, the resistance of the source/drain structure SD21 is smaller than the resistance of the source/drain structure SD22.

In some embodiments, the resistances of the source/drain structures SD21 and SD22 indicate a logic value of the transistor cell 200. For example, when the resistance of the source/drain structure SD21 is larger than the resistance of the source/drain structure SD22, the transistor cell 200 has the logic value of 1. When the resistance of the source/drain structure SD21 is smaller than the resistance of the source/drain structure SD22, the transistor cell 200 has the logic value of 0.

Referring to FIG. 1 and FIG. 2, when the transistor cell 200 has the logic value of 1, the current level of the current signal IL1N is smaller than the current level of the current signal IB1N, and the comparator compares the current signals IL1N and IB1N to generate the output bit BIN having the logic value of 1. When the transistor cell 200 has the logic value of 0, the current level of the current signal IL1N is larger than the current level of the current signal IB1N, and the comparator compares the current signals IL1N and IB1N to generate the output bit BIN having the logic value of 0.

Referring to FIG. 1 and FIG. 2, when the transistor cell TC(N, M) is activated by the word line circuit 110 and the bit line circuit 120 according to the challenge signal CS11, the word line circuit 110 adjusts the word line signal W1M to an enable voltage level to turn on each of the transistors T21 and T22, and the bit line circuit 120 adjusts each of the voltage levels of the bit line signals BL1N and BB1N to a voltage level (such as the voltage level of the bit line signals BL10 and BB10) different from a voltage level of the voltage signal SL11. Accordingly, the transistor cell TC(N, M) provides the current signals IL1N and IB1N to the comparator SA1N.

At this time, in response to the transistor cells of the transistor circuit 130 other than the transistor cell TC(N, M) being not selected by the challenge signal CS11, each of the word line signals W11-W1(M−1) has a disable voltage level to turns off transistors similar with the transistors T21 and T22 in the unselected transistor cells, such that the rows RW1-RW(M−1) do not generate the current signals IL11-IL1N and IB11-IB1N. Each of the bit line signals BL11-BL1(N−1) and BB11-BB1(N−1) is floated or has the voltage level of the voltage signal SL11, such that such that the column CL1-CL(N−1) do not generate the current signals IL11-IL1(N−1) and IB11-IB1(N−1).

In some embodiments, when the challenge signal CS11 selects two or more of the columns CL1-CLN, corresponding four or more of the bit line signals BL11-BL1(N−1) and BB11-BB1(N−1) having the voltage level different from the voltage level of the voltage signal SL11. Accordingly, corresponding four or more of the current signals IL11-IL1(N−1) and IB11-IB1(N−1) are generated, and corresponding two or more of the comparators SA11-SA1N generates corresponding two or more of the output bits B11-BIN.

Figure 3A:
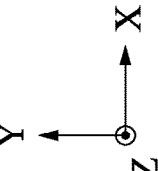
FIG. 3A is a cross section diagram of a semiconductor device corresponding to the semiconductor device shown in FIG. 1, in accordance with some embodiments of the present disclosure.

FIG. 3A is a cross section diagram of a semiconductor device 300 corresponding to the semiconductor device 100 shown in FIG. 1, in accordance with some embodiments of the present disclosure. Lines L31-L33 are illustrated in FIG. 3A. Cross section diagrams of the semiconductor device 300 along the Lines L31-L33 are discussed below with the embodiments associated with the FIG. 3B to FIG. 3D. It is noted that a Z direction points out from the paper in FIG. 3A.

As illustratively shown in FIG. 3A, the semiconductor device 300 includes a transistor cell 310, bit lines BB31, BL31, a substrate SB3 and isolation structures IS31, IS32. The transistor cell 310 includes transistors 311-313. Along a Y direction, the transistor 312 is stacked on the transistor 311, and the transistor 313 is stacked on the transistor 312.

As illustratively shown in FIG. 3A, the transistor 311 includes source/drain structures SD31 and SD32, a gate structure G31, channels CN31, spacers SP31 and gate oxides GX31. The transistor 312 includes source/drain structures SD33 and SD34, a gate structure G32, channels CN32, spacers SP32 and gate oxides GX32. The transistor 313 includes source/drain structures SD35 and SD36, a gate structure G33, channels CN33, spacers SP33 and gate oxides GX33.

In some embodiments, the bit line BL31 is implemented by conductive material, such as copper (Cu). The source/drain structures SD31-SD36 and channels CN31-CN33 are implemented by semiconductor material, such as silicon (Si) and/or Silicon-germanium (SiGe). The substrate SB3 is implemented by semiconductor material, such as silicon (Si). The spacers SP31-SP33 and the isolation structures IS31, IS32 are implemented by insulator, such as silicon oxide (SiO2). The gate oxides GX31-GX33 are implemented by oxide material, such as silicon oxide (SiO2) and/or hafnium oxide (HfO2). The gate structures G31-G33 are implemented by gate metal, such as tungsten (W). The bit line BL31 is implemented by buried metal or backside metal, such as ruthenium (Ru) and/or tungsten (W).

As illustratively shown in FIG. 3A, the bit line BB31 extends along an X direction. The X direction is perpendicular to the Y direction in some embodiments. The substrate SB3 is formed above the bit line BB31. A portion of the bit line BB31 extends through the substrate SB3 along the Y direction to be coupled with the source/drain structure SD31.

As illustratively shown in FIG. 3A, each of the source/drain structures SD31, SD32 and the gate structure G31 is formed above the substrate SB3. The source/drain structure SD32, the gate structure G31 and the source/drain structure SD31 are arranged in order along the X direction. The channels CN31 extend through the gate structure G31 along the X direction, and are coupled to each of the source/drain structure SD31 and SD32. The spacers SP31 are formed between the gate structure G31 and each of the source/drain structure SD31 and SD32. The gate oxides GX31 are formed between the gate structure G31 and the spacers SP31, and between the gate structure G31 and the channels CN31.

As illustratively shown in FIG. 3A, each of the source/drain structures SD33 and SD34 and the gate structure G32 are formed above the transistor 311. The source/drain structure SD33, the gate structure G32 and the source/drain structure SD34 are arranged in order along the X direction. The channels CN32 extend through the gate structure G32 along the X direction, and are coupled to each of the source/drain structure SD33 and SD34. The spacers SP32 are formed between the gate structure G32 and each of the source/drain structure SD33 and SD34. The gate oxides GX32 are formed between the gate structure G32 and the spacers SP32, and between the gate structure G32 and the channels CN32.

As illustratively shown in FIG. 3A, the isolation structure IS31 is formed between the source/drain structures SD31 and SD34 to isolate the source/drain structures SD31 and SD34 from each other, and is formed between the gate structures G31 and G32 to isolate the gate structures G31 and G32 from each other. The source/drain structure SD33 is formed above and is coupled to the source/drain structure SD32.

As illustratively shown in FIG. 3A, the each of the source/drain structures SD35 and SD36 and the gate structure G33 are formed above the transistor 312. The source/drain structure SD36, the gate structure G33 and the source/drain structure SD35 are arranged in order along the X direction. The channels CN33 extend through the gate structure G33 along the X direction, and are coupled to each of the source/drain structure SD35 and SD36. The spacers SP33 are formed between the gate structure G33 and each of the source/drain structure SD35 and SD36. The gate oxides GX33 are formed between the gate structure G33 and the spacers SP33, and between the gate structure G33 and the channels CN33.

As illustratively shown in FIG. 3A, the isolation structure IS32 is formed between the source/drain structures SD33 and SD36 to isolate the source/drain structures SD33 and SD36 from each other, and is formed between the gate structures G33 and G32 to isolate the gate structures G33 and G32 from each other. The source/drain structure SD35 is formed above and is coupled to the source/drain structure SD34. The bit line BL31 extends along the X direction, is formed above and is coupled to the source/drain structure SD36.

Referring to FIG. 1 to FIG. 3A, the transistor cell 310 is an embodiment of each of the transistor cells TC(1, M)-TC (N, M) and 200. The transistors 313, 311, the gate structure G32 and the source/drain structures SD33 and SD34 are embodiments of the transistors T21, T22, the gate structure G21 and the source/drain structures SD22 and SD21, respectively. Each of the gate structures G31 and G33 are configured to receive the word line signal W1M. The bit lines BL31 and BB31 are configured to receive the bit line signals BLIN and BB1N, respectively. Therefore, some descriptions are not repeated for brevity.

In some embodiments, the source/drain structure SD34 is configured to receive the voltage signal SL11 to generate the current signal IL1N flowing from the source/drain structure SD34 through the source/drain structure SD35, the channel CN33 and the source/drain structure SD36 in order, to the bit line BL31. The source/drain structure SD33 is configured to receive the voltage signal SL11 to generate the current signal IB1N flowing from the source/drain structure SD33 through the source/drain structure SD32, the channel CN31 and the source/drain structure SD31 in order, to the bit line BB31.

In some approaches, a transistor cell having a logic value of a PUF is formed by three transistors. The three transistors are formed on a same surface and are not stacked on each other. As a result, a large area is required for the transistor cell of the PUF.

Compared to the above approaches, in some embodiments of the present disclosure, the transistors 311-313 are stacked in order along the Y direction. As a result, a required area of the transistor cell 310 is reduced by three times.

In some embodiments, the source/drain structures SD32 and SD33 are directly contact with each other to form a boundary BD31, and the source/drain structures SD34 and SD35 are directly contact with each other to form a boundary BD32. Each of the boundaries BD31 and BD32 has a source/drain interface parasitic resistance which is randomly distributed in response to the manufacturing process. The resistances of the source/drain structures SD33 and SD34 includes the resistances of the boundaries BD31 and BD32, respectively. The current signals IB1N and IL1N flow through the boundaries BD31 and BD32, respectively. In response to the variations of the resistances of the boundaries BD31 and BD32, randomness of the resistances of the source/drain structures SD33 and SD34 is increased. Accordingly, randomness of the current level of the current signals IL1N and IB1N is increased.

In some approaches, a transistor cell having a logic value of a PUF is formed by three transistors. Source/drain structures of the three transistors are not directly contact with each other. No boundaries are formed to provide random source/drain interface parasitic resistances. As a result, a randomness of the PUF is limited.

Compared to the above approaches, in some embodiments of the present disclosure, the boundaries BD31 and BD32 are formed by the contacting of the source/drain structures SD32-SD35. The resistances of the boundaries BD31 and BD32 provide more variation to the current signals IL1N and IB1N. As a result, a randomness of the output bit BIN of the PUF is increased.

In some embodiments, one of the source/drain structures SD32 and SD33 is implemented as an N-type doped material, and another one of the source/drain structures SD32 and SD33 is implemented as a P-type doped material. In such embodiments, the boundary BD31 is referred to as an N/P doped tunneling junction. In some embodiments, each of the source/drain structures SD32 and SD33 is implemented as an N-type doped material. In such embodiments, the boundary BD31 is referred to as an N/N interface. Similarly, the boundary BD32 is implemented by an N/P junction or an N/N interface according to materials of the source/drain structures SD34 and SD35.

FIG. 3B is a cross section diagram of the semiconductor device 300 along the line L31 shown in FIG. 3A, in accordance with some embodiments of the present disclosure. The X direction points out from the paper in FIG. 3B.

As illustratively shown in FIG. 3B, the semiconductor device 300 further includes isolation structures IS34, IS35, a conductive segment CS31, a via V33 and a source line SL31.

As illustratively shown in FIG. 3B, the substrate SB3, the source/drain structures SD32 and SD33, the isolation structure IS32, the source/drain structure SD36 and the bit line BL31 are arranged in order along the Y direction. The source/drain structures SD32 and SD33 contact with each other to form the boundary BD31. The isolation structure IS32 extends along the Z direction to isolate the source/drain structures SD36 and SD33 from each other.

As illustratively shown in FIG. 3B, the isolation structure IS35, the conductive segment CS31, the via V33 and the source line SL31 are arranged in order along the Y direction. The isolation structure IS35 is formed between the source/drain structure SD32 and the conductive segment CS31 to isolate the source/drain structure SD32 and the conductive segment CS31 from each other. The conductive segment CS31 is coupled to each of the source/drain structure SD33 and the via V33. The via V33 extends along the Y direction to be coupled to the source line SL31.

As illustratively shown in FIG. 3B, the isolation structure IS34 extend along the Y direction, and is formed between the source/drain structure SD36 and the via V33, to isolate the source/drain structure SD36 and the bit line BL31 from the conductive segment CS31, the via V33 and the source line SL31. In some embodiments, the isolation structures IS34 and IS31 are connected with each other.

Referring to FIG. 2 and FIG. 3B, in some embodiments, the source line SL31 is configured to provide the voltage signal SL11 through the via V33 and the conductive segment CS31 to the source/drain structure SD33, such that the source/drain structure SD33 generates the current signal IB1N at least according to the resistances of the source/drain structure SD33 and the boundary BD31.

Figure 3C:
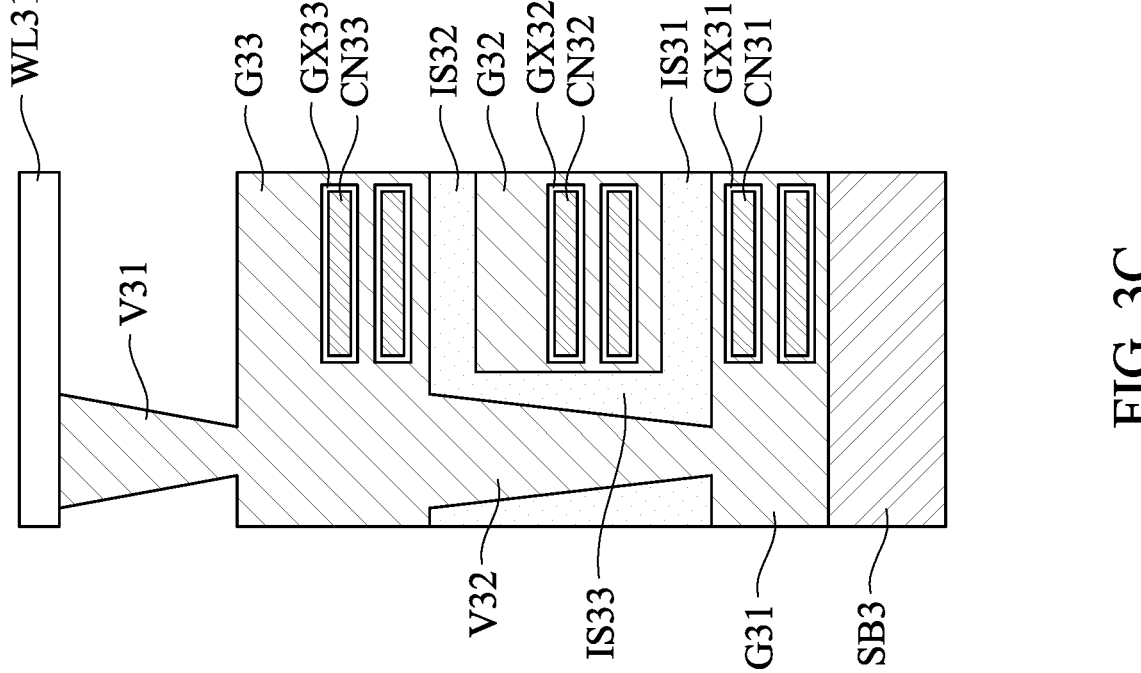
FIG. 3C is a cross section diagram of the semiconductor device along a line shown in FIG. 3A, in accordance with some embodiments of the present disclosure.
Figure 3C:
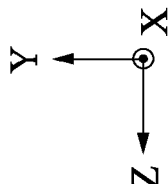

FIG. 3C is a cross section diagram of the semiconductor device 300 along the line L32 shown in FIG. 3A, in accordance with some embodiments of the present disclosure. The X direction points out from the paper in FIG. 3C. As illustratively shown in FIG. 3C, the semiconductor device 300 further includes a word line WL31, vias V31, V32 and an isolation structure IS33.

As illustratively shown in FIG. 3C, the word line WL31 extends along the Z direction. The via V31 is formed between the word line WL31 and the gate structure G33, and extends along the Y direction to couple the word line WL31 to the gate structure G33. The via V32 is formed between the gate structures G33 and G31, and extends along the Y direction to couple the gate structures G33 and G31 to each other. The isolation structure IS32 extends along the Z direction to isolate the gate structures G33 and G32 from each other. The isolation structure IS31 extends along the Z direction to isolate the gate structures G31 and G32 from each other. The isolation structure IS33 is formed between the via V32 and the gate structure G32, and extends along the Y direction to isolate the gate structure G32 from the via V32. In some embodiments, the isolation structure IS33 is connected to each of the isolation structures IS31 and IS32.

Referring to FIG. 2 and FIG. 3C, in some embodiments, the word line WL31 is configured to receive the word line signal W1M. The via V31 is configured to provide the word line signal W1M from the word line WL31 to the gate structure G33. The via V32 is configured to provide the word line signal W1M from the gate structure G31 to the gate structure G33.

FIG. 3D is a cross section diagram of the semiconductor device 300 along the line L33 shown in FIG. 3A, in accordance with some embodiments of the present disclosure. The X direction points out from the paper in FIG. 3D. As illustratively shown in FIG. 3D, the semiconductor device 300 further includes isolation structures IS36, a conductive segment CS32 and a via V34.

As illustratively shown in FIG. 3D, the substrate SB3, the source/drain structure SD31, the isolation structure IS31 and the source/drain structures SD34 and SD35 are arranged in order along the Y direction. The bit line BB31 extends through the substrate SB3 to be coupled with the source/drain structure SD31. The source/drain structures SD34 and SD35 contact with each other to form the boundary BD32.

As illustratively shown in FIG. 3D, the isolation structure IS31, the conductive segment CS32, the via V34 and the source line SL31 are arranged in order along the Y direction. The isolation structure IS31 extends along the Z direction to isolate the source/drain structure SD34 from the source/drain structure SD31 and the conductive segment CS32. The isolation structure IS36 is formed between the source/drain structure SD35 and the via V34, to isolate the source/drain structure SD35 from the conductive segment CS32, the via V34 and the source line SL31. The via V34 extends along the Y direction to be coupled to each of the conductive segment CS32 and the source line SL31.

Referring to FIG. 2 and FIG. 3D, in some embodiments, the source line SL31 is configured to provide the voltage signal SL11 through the via V34 and the conductive segment CS32 to the source/drain structure SD34, such that the source/drain structure SD34 generates the current signal IL1N at least according to the resistances of the source/drain structure SD34 and the boundary BD32.

Figure 4:
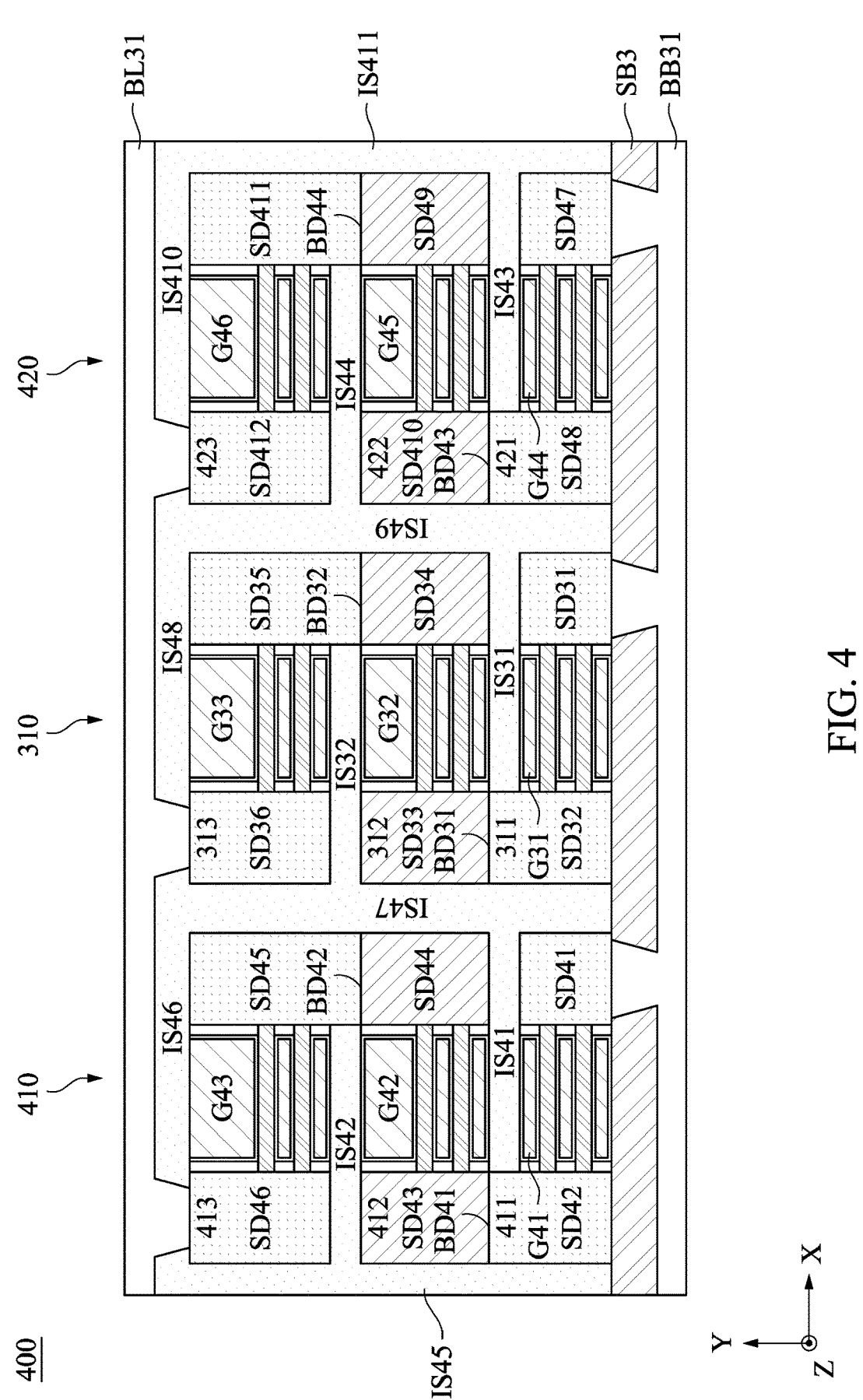
FIG. 4 is a cross section diagram of a semiconductor device corresponding to the semiconductor device shown in FIG. 3A, in accordance with some embodiments of the present disclosure.

FIG. 4 is a cross section diagram of a semiconductor device 400 corresponding to the semiconductor device 300 shown in FIG. 3A, in accordance with some embodiments of the present disclosure. Referring to FIG. 3A and FIG. 4, the semiconductor device 400 is an alternative embodiment of the semiconductor device 300. FIG. 4 follows a similar labeling convention to that of FIG. 3A. For brevity, the discussion will focus more on differences between FIG. 3A and FIG. 4 than on similarities.

Referring to FIG. 3A and FIG. 4, compared to the semiconductor device 300, the semiconductor device 400 further includes transistor cells 410, 420 and isolation structures IS41-IS411. Configurations of each of the transistor cells 410 and 420 are similar with the configurations of the transistor cell 310. For example, each of the transistor cells 410 and 420 includes channels, spacers and gate oxides similar with the channels CN31-CN33, the spacers SP31-SP33 and the gate oxides GX31-GX33 of the transistor cell 310. Therefore, some descriptions are not repeated for brevity.

Referring to FIG. 1 and FIG. 4, the transistor cells 310, 410 and 420 are embodiments of three transistor cells in one of the columns CL1-CLN. For example, the transistor cells 310, 410 and 420 corresponds to the transistor cells TC(N, 1)-TC(N, 3), respectively. Referring to FIG. 2 and FIG. 4, each of the transistor cells 410 and 420 has a circuit structure similar with the transistor cell 200. Therefore, some descriptions are not repeated for brevity.

As illustratively shown in FIG. 4, the isolation structure IS45, the transistor cell 410, the isolation structure IS47, the transistor cell 310, the isolation structure IS49, the transistor cell 420 and the isolation structure IS411 are arranged in order along the X direction. The isolation structure IS47 extends along the Y direction and is configured to isolate the transistor cells 310 and 410 from each other. The isolation structure IS49 extends along the Y direction and is configured to isolate the transistor cells 420 and 410 from each other. The isolation structure IS45 extends along the Y direction and is configured to isolate the transistor cell 410 from other transistor cells (not shown in figures). The isolation structure IS411 extends along the Y direction and is configured to isolate the transistor cell 420 from other transistor cells (not shown in figures).

As illustratively shown in FIG. 4, the transistor cell 410 includes transistors 411-413, and the transistor cell 420 includes transistors 421-423. Along a Y direction, the transistor 412 is stacked on the transistor 411, the transistor 413 is stacked on the transistor 412, the transistor 422 is stacked on the transistor 421, and the transistor 423 is stacked on the transistor 422.

As illustratively shown in FIG. 4, the transistor 411 includes source/drain structures SD41, SD42 and a gate structure G41. The transistor 412 includes source/drain structures SD43, SD44 and a gate structure G42. The transistor 413 includes source/drain structures SD45, SD46 and a gate structure G43. The transistor 421 includes source/drain structures SD47, SD48 and a gate structure G44. The transistor 422 includes source/drain structures SD49, SD410 and a gate structure G45. The transistor 423 includes source/drain structures SD411, SD412 and a gate structure G46.

As illustratively shown in FIG. 4, portions of the bit line BB31 extends through the substrate SB3 along the Y direction to be coupled with each of the source/drain structures SD31, SD41 and SD47. Each of the source/drain structures SD31, SD32, SD41, SD42, SD47, SD48 and the gate structures G31, G41, G44 are formed above the substrate SB3. The source/drain structure SD42, the gate structure G41, the source/drain structures SD41 and SD32, the gate structure G31, the source/drain structures SD31 and SD48, the gate structure G44 and the source/drain structure SD47 are arranged in order along the X direction.

As illustratively shown in FIG. 4, each of the source/drain structures SD33, SD34, SD43, SD44, SD49, SD410 and the gate structures G32, G42, G45 are formed above the transistors 411, 311 and 421. The source/drain structure SD43, the gate structure G42, the source/drain structures SD44 and SD33, the gate structure G32, the source/drain structures SD34 and SD410, the gate structure G45 and the source/drain structure SD49 are arranged in order along the X direction.

As illustratively shown in FIG. 4, the isolation structure IS41 is formed between the source/drain structures SD41 and SD44 to isolate the source/drain structures SD41 and SD44 from each other, and is formed between the gate structures G41 and G42 to isolate the gate structures G41 and G42 from each other. The source/drain structure SD43 is formed above and is coupled to the source/drain structure SD42. The isolation structure IS43 is formed between the source/drain structures SD47 and SD49 to isolate the source/drain structures SD47 and SD49 from each other, and is formed between the gate structures G44 and G45 to isolate the gate structures G44 and G45 from each other. The source/drain structure SD410 is formed above and is coupled to the source/drain structure SD48.

As illustratively shown in FIG. 4, each of the source/drain structures SD36, SD35, SD46, SD45, SD411, SD412 and the gate structures G33, G43, G46 are formed above the transistors 412, 312 and 422. The source/drain structure SD46, the gate structure G43, the source/drain structures SD45 and SD36, the gate structure G33, the source/drain structures SD35 and SD412, the gate structure G46 and the source/drain structure SD411 are arranged in order along the X direction.

As illustratively shown in FIG. 4, the isolation structure IS42 is formed between the source/drain structures SD43 and SD46 to isolate the source/drain structures SD43 and SD46 from each other, and is formed between the gate structures G42 and G43 to isolate the gate structures G42 and G43 from each other. The source/drain structure SD45 is formed above and is coupled to the source/drain structure SD44. The isolation structure IS44 is formed between the source/drain structures SD410 and SD412 to isolate the source/drain structures SD410 and SD412 from each other, and is formed between the gate structures G45 and G46 to isolate the gate structures G45 and G46 from each other. The source/drain structure SD411 is formed above and is coupled to the source/drain structure SD49.

As illustratively shown in FIG. 4, the isolation structure IS47 is configured to isolate the source/drain structures SD41, SD44 and SD45 from the source/drain structures SD32, SD33 and SD36. The isolation structure IS49 is configured to isolate the source/drain structures SD412, SD410 and SD48 from the source/drain structures SD35, SD34 and SD31.

As illustratively shown in FIG. 4, the bit line BL31 extends along the X direction, is formed above and is coupled to each of the source/drain structures SD36, SD46 and SD412. The isolation structure IS46 is formed between the bit line BL31 and each of the gate structure G43 and the source/drain structure G45, to isolate the bit line BL31 from the gate structure G43 and the source/drain structure G45. The isolation structure IS48 is formed between the bit line BL31 and each of the gate structure G33 and the source/drain structure G35, to isolate the bit line BL31 from the gate structure G33 and the source/drain structure G35. The isolation structure IS410 is formed between the bit line BL31 and the source/drain structure G411, to isolate the bit line BL31 from the gate structure G46 and the source/drain structure G411. Each of the isolation structures IS46, IS46 and IS410 extends along the X direction.

In some embodiments, the isolation structure IS45 is connected to the isolation structure IS42. The isolation structure IS47 is connected to each of the isolation structures IS41, IS32 and IS46. The isolation structure IS49 is connected to each of the isolation structures IS31, IS44 and IS48. The isolation structure IS411 is connected to each of the isolation structures IS43 and IS410.

Referring to FIG. 1, FIG. 2 and FIG. 4, when the challenges signal CS11 selects the transistor cell 410, the source/drain structure SD44 receives the voltage signal SL11 to generate the current signal IL1N flowing from the source/drain structure SD44 through the source/drain structures SD45, SD46 in order, to the bit line BL31. The source/drain structure SD43 receives the voltage signal SL11 to generate the current signal IB1N flowing from the source/drain structure SD43 through the source/drain structures SD42, SD41 in order, to the bit line BB31.

Similarly, when the challenges signal CS11 selects the transistor cell 420, the source/drain structure SD49 receives the voltage signal SL11 to generate the current signal IL1N flowing from the source/drain structure SD49 through the source/drain structures SD411. SD412 in order, to the bit line BL31. The source/drain structure SD410 receives the voltage signal SL11 to generate the current signal IB1N flowing from the source/drain structure SD410 through the source/drain structures SD48, SD47 in order, to the bit line BB31.

In some embodiments, the source/drain structures SD42 and SD43 are directly contact with each other to form a boundary BD41, the source/drain structures SD44 and SD45 are directly contact with each other to form a boundary BD42, the source/drain structures SD48 and SD410 are directly contact with each other to form a boundary BD43, and the source/drain structures SD49 and SD411 are directly contact with each other to form a boundary BD44. The features of the boundaries BD41-BD44 are similar with the features of the boundaries BD31-BD32. Therefore, some descriptions are not repeated for brevity.

Figure 5:
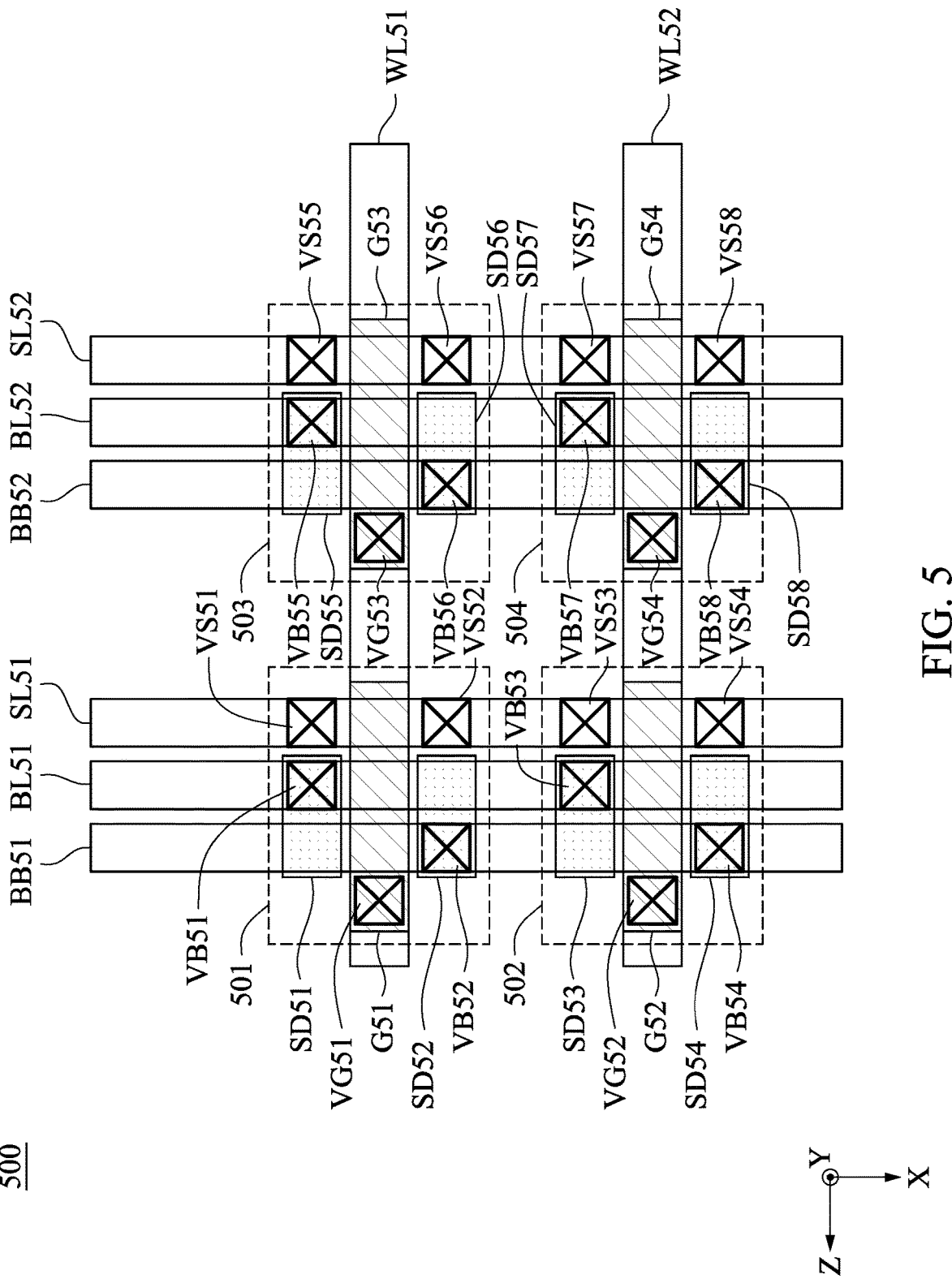
FIG. 5 is a layout diagram of a semiconductor device corresponding to the semiconductor device shown in FIG. 3A, in accordance with some embodiments of the present disclosure.

FIG. 5 is a layout diagram of a semiconductor device 500 corresponding to the semiconductor device 300 shown in FIG. 3A, in accordance with some embodiments of the present disclosure. As illustratively shown in FIG. 5, the semiconductor device 500 includes transistor cells 501-504, bit lines BL51, BL52, BB51, BB52, word lines WL51, WL52, source lines SL51, SL52 and vias VB51-VB58, VG51-VG54, VS51-VS58.

As illustratively shown in FIG. 5, the transistor cell 501 includes source/drain structures SD51, SD52 and a gate structure VG51. The transistor cell 502 includes source/drain structures SD53, SD54 and a gate structure VG52. The transistor cell 503 includes source/drain structures SD55, SD56 and a gate structure VG53. The transistor cell 502 includes source/drain structures SD57, SD58 and a gate structure VG54.

As illustratively shown in FIG. 5, each of the bit lines BL51, BL52, BB51, BB52 and the source lines SL21 and SL22 extends along the X direction, and each of the word lines WL51 and WL52 extends along the Z direction. The bit line BL51 is overlapped with the word lines WL51, WL52, the source/drain structures SD51-SD54 and the gate structures VG51, VG52, and is coupled to the source/drain structures SD51 and SD53 through the vias VB51 and VB53, respectively. The bit line BB51 is overlapped with the word lines WL51, WL52, the source/drain structures SD51-SD54 and the gate structures VG51, VG52, and is coupled to the source/drain structures SD52 and SD54 through the vias VB52 and VB54, respectively.

Similarly, the bit line BL52 is overlapped with the word lines WL51, WL52, the source/drain structures SD55-SD58 and the gate structures VG53, VG54, and is coupled to the source/drain structures SD55 and SD57 through the vias VB55 and VB57, respectively. The bit line BB52 is overlapped with the word lines WL51, WL52, the source/drain structures SD55-SD58 and the gate structures VG53, VG54, and is coupled to the source/drain structures SD56 and SD58 through the vias VB56 and VB58, respectively.

As illustratively shown in FIG. 5, the word line WL51 is overlapped with the gate structures G51 and G53, and is coupled to the gate structures G51 and G53 through the vias VG51 and VG53, respectively. The word line WL52 is overlapped with the gate structures G52 and G54, and is coupled to the gate structures G52 and G54 through the vias VG52 and VG54, respectively.

As illustratively shown in FIG. 5, the source line SL51 is overlapped with the word lines WL51 and WL52, is coupled to the transistor cell 501 through the vias VS51 and VS52, and is coupled to the transistor cell 502 through the vias VS53 and VS54. The source line SL52 is overlapped with the word lines WL51 and WL52, is coupled to the transistor cell 503 through the vias VS55 and VS56, and is coupled to the transistor cell 502 through the vias VS57 and VS58.

Referring to FIG. 5 and FIG. 3A to FIG. 3D, in some embodiments, each of the transistor cells 501-504 is implemented by a structure similar with the structure of the transistor cell 310. Each of the source/drain structures SD51, SD53, SD55 and SD57 corresponds to the source/drain structure SD36. Each of the source/drain structures SD52, SD54, SD56 and SD58 corresponds to the source/drain structure SD31. Each of the bit lines BL51 and BL52 corresponds to the bit line BL31. Each of the bit lines BB51 and BB52 corresponds to the bit line BB31. Each of the word lines WL51 and WL52 corresponds to the word line WL31. Each of the gate structures G51-G54 corresponds to the gate structure G33. Each of the vias VG51-VG54 corresponds to the via V31. Each of the source lines SL51 and SL52 corresponds to the source line SL31. Each of the vias VS51, VS53, VS55 and VS57 corresponds to the via V33. Each of the vias VS52, VS54, VS56 and VS58 corresponds to the via V34.

Referring to FIG. 5 and FIG. 4, in some embodiments, two of the transistor cells 501-504 are implemented by two of the transistor cells 410, 310 and 420. For example, the transistor cells 501 and 502 are implemented by the transistor cells 410 and 310, respectively. In such example, the bit lines BL51, BB51, the source/drain structures SD51-SD54 and the gate structures G51, G52 are implemented by the bit lines BL31, BB31, the source/drain structures SD46, SD41, SD36, SD31 and the gate structures G43, G33, respectively.

Figure 6A:
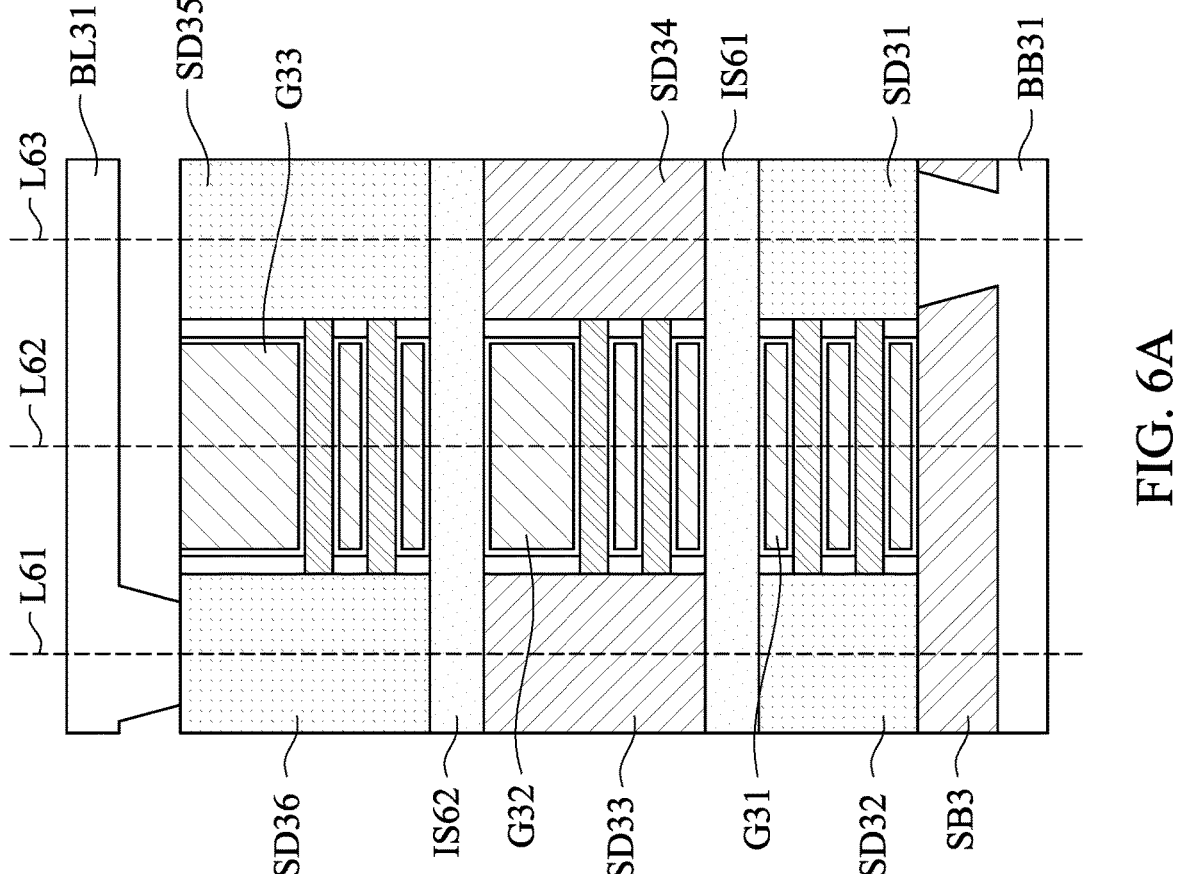
FIG. 6A is a cross section diagram of a semiconductor device corresponding to the semiconductor device shown in FIG. 3A, in accordance with some embodiments of the present disclosure.
Figure 6A:
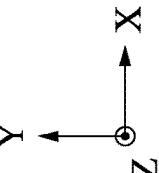

FIG. 6A is a cross section diagram of a semiconductor device 600 corresponding to the semiconductor device 300 shown in FIG. 3A, in accordance with some embodiments of the present disclosure. Lines L61-L63 are illustrated in FIG. 6A. Cross section diagrams of the semiconductor device 600 along the Lines L61-L63 are discussed below with the embodiments associated with the FIG. 6B to FIG. 6D. The Z direction points out from the paper in FIG. 6A.

Referring to FIG. 3A and FIG. 6A, the semiconductor device 600 is an alternative embodiment of the semiconductor device 300. FIG. 6A follows a similar labeling convention to that of FIG. 3A. For brevity, the discussion will focus more on differences between FIG. 3A and FIG. 6A than on similarities.

Referring to FIG. 3A and FIG. 6A, compared to the semiconductor device 300, the semiconductor device 600 includes isolation structures IS61 and IS62 instead of the isolation structures IS31 and IS32. Each of the isolation structures IS61 and IS62 extends along the X direction. The isolation structure IS61 is configured to isolate the source/drain structures SD31, SD32 and the gate structure G31 from the source/drain structures SD33, SD34 and the gate structure G32. The isolation structure IS62 is configured to isolate the source/drain structures SD33, SD34 and the gate structure G32 from the source/drain structures SD35, SD36 and the gate structure G33.

Figure 6B:
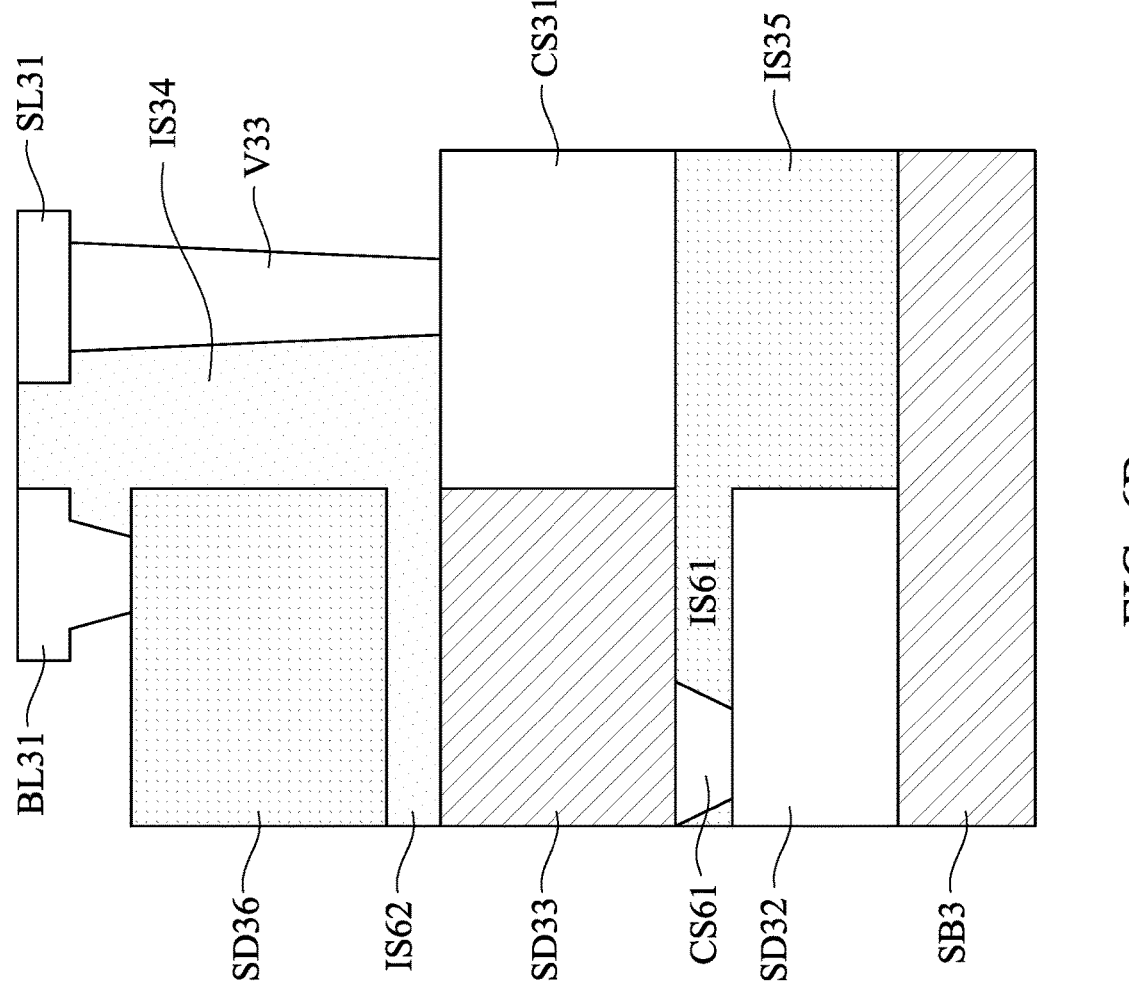
FIG. 6B is a cross section diagram of the semiconductor device along a line shown in FIG. 6A, in accordance with some embodiments of the present disclosure.
Figure 6B:
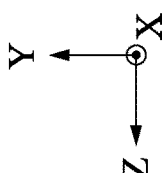

FIG. 6B is a cross section diagram of the semiconductor device 600 along the line L61 shown in FIG. 6A, in accordance with some embodiments of the present disclosure. The X direction points out from the paper in FIG. 6B.

Referring to FIG. 3B and FIG. 6B, the semiconductor device 600 is an alternative embodiment of the semiconductor device 300. FIG. 6B follows a similar labeling convention to that of FIG. 3B. For brevity, the discussion will focus more on differences between FIG. 3B and FIG. 6B than on similarities.

Referring to FIG. 3B and FIG. 6B, compared to the semiconductor device 300, the semiconductor device 600 further includes a conductive segment CS61. The conductive segment CS61 is formed between the source/drain structures SD33 and SD32, and extends through the isolation structure IS61 to couple the source/drain structures SD33 and SD32 to each other. In some embodiments, the isolation structures IS61 and IS62 are connected to the isolation structures IS35 and IS34, respectively.

FIG. 6C is a cross section diagram of the semiconductor device 600 along the line L62 shown in FIG. 6A, in accordance with some embodiments of the present disclosure. The X direction points out from the paper in FIG. 6C.

Referring to FIG. 3C and FIG. 6C, the semiconductor device 600 is an alternative embodiment of the semiconductor device 300. FIG. 6C follows a similar labeling convention to that of FIG. 3C. For brevity, the discussion will focus more on differences between FIG. 3C and FIG. 6C than on similarities.

Referring to FIG. 3C and FIG. 6C, compared to the semiconductor device 300, the semiconductor device 600 includes the isolation structures IS61 and IS62 instead of the isolation structures IS31 and IS32. The relationships between the isolation structures IS61, IS62 and other elements of the semiconductor device 600 are similar with the relationships between the isolation structures IS31, IS32 and other elements of the semiconductor device 300. Therefore, some descriptions are not repeated for brevity.

FIG. 6D is a cross section diagram of the semiconductor device 600 along the line L63 shown in FIG. 6A, in accordance with some embodiments of the present disclosure. The X direction points out from the paper in FIG. 6D.

Referring to FIG. 3D and FIG. 6D, the semiconductor device 600 is an alternative embodiment of the semiconductor device 300. FIG. 6D follows a similar labeling convention to that of FIG. 3D. For brevity, the discussion will focus more on differences between FIG. 3D and FIG. 6D than on similarities.

Referring to FIG. 3B and FIG. 6B, compared to the semiconductor device 300, the semiconductor device 600 further includes a conductive segment CS62. The conductive segment CS62 is formed between the source/drain structures SD34 and SD35, and extends through the isolation structure IS62 to couple the source/drain structures SD34 and SD35 to each other.

FIG. 7 is a cross section diagram of a semiconductor device 700 corresponding to the semiconductor device 300 shown in FIG. 3A, in accordance with some embodiments of the present disclosure. The Z direction points out from the paper in FIG. 7.

Referring to FIG. 3A and FIG. 7, the semiconductor device 700 is an alternative embodiment of the semiconductor device 300. FIG. 7 follows a similar labeling convention to that of FIG. 3A. For brevity, the discussion will focus more on differences between FIG. 3A and FIG. 7 than on similarities.

Referring to FIG. 3A and FIG. 7, compared to the semiconductor device 300, the semiconductor device 700 includes transistor cell 710, bit lines BL71, BB71 and a substrate SB7 instead of the transistor cell 310, the bit lines BL31, BB31 and the substrate SB3. The transistor cell 710, the bit lines BL71, BB71 and the substrate SB7 are alternative embodiments of the transistor cell 310, the bit lines BL31, BB31 and the substrate SB3. Therefore, some descriptions are not repeated for brevity.

Referring to FIG. 3A and FIG. 7, compared to the transistor cell 310, the transistor cell 710 further includes transistors 711 and 712. The transistor 711 is formed above the substrate SB7. The transistor 311 is stacked on the transistor 711. The transistor 712 is stacked on the transistor 311. Along the Y direction, the substrate SB7, the transistors 711, 311-313, 712 and the bit line BL71 are arranged in order.

As illustratively shown in FIG. 7, the transistor 711 includes source/drain structures SD71, SD72 and a gate structure G71. The transistor 712 includes source/drain structures SD73, SD74 and a gate structure G72. The source/drain structures SD71-SD74 are coupled to the source/drain structures SD31, SD32, SD36 and SD35, respectively.

In some embodiments, the source/drain structures SD71 and SD72 correspond to two terminals of the transistor 711, respectively. The source/drain structures SD31 and SD32 correspond to two terminals of the transistor 311, respectively. The source/drain structures SD35 and SD36 correspond to two terminals of the transistor 313, respectively. The source/drain structures SD73 and SD74 correspond to two terminals of the transistor 712, respectively. Accordingly, the transistors 311 and 711 are coupled in parallel with each other, and the transistors 313 and 712 are coupled in parallel with each other.

Referring to FIG. 2 and FIG. 7, in some embodiments, the transistor cell 200 is implemented by the transistor cell 710. In such embodiments, the transistor T21 corresponds to the transistors 313 and 712, and the transistor T22 corresponds to the transistors 311 and 711. Each of the gate structures G31-G33 and G71-G72 is configured to receive the word line signal W1M. The current signal IB1N is transmitted from the source/drain structure SD33 through the transistors 311 and 711 to the bit line BB71, and the current signal IL1N is transmitted from the source/drain structure SD34 through the transistors 313 and 712 to the bit line BL71.

Figure 8:
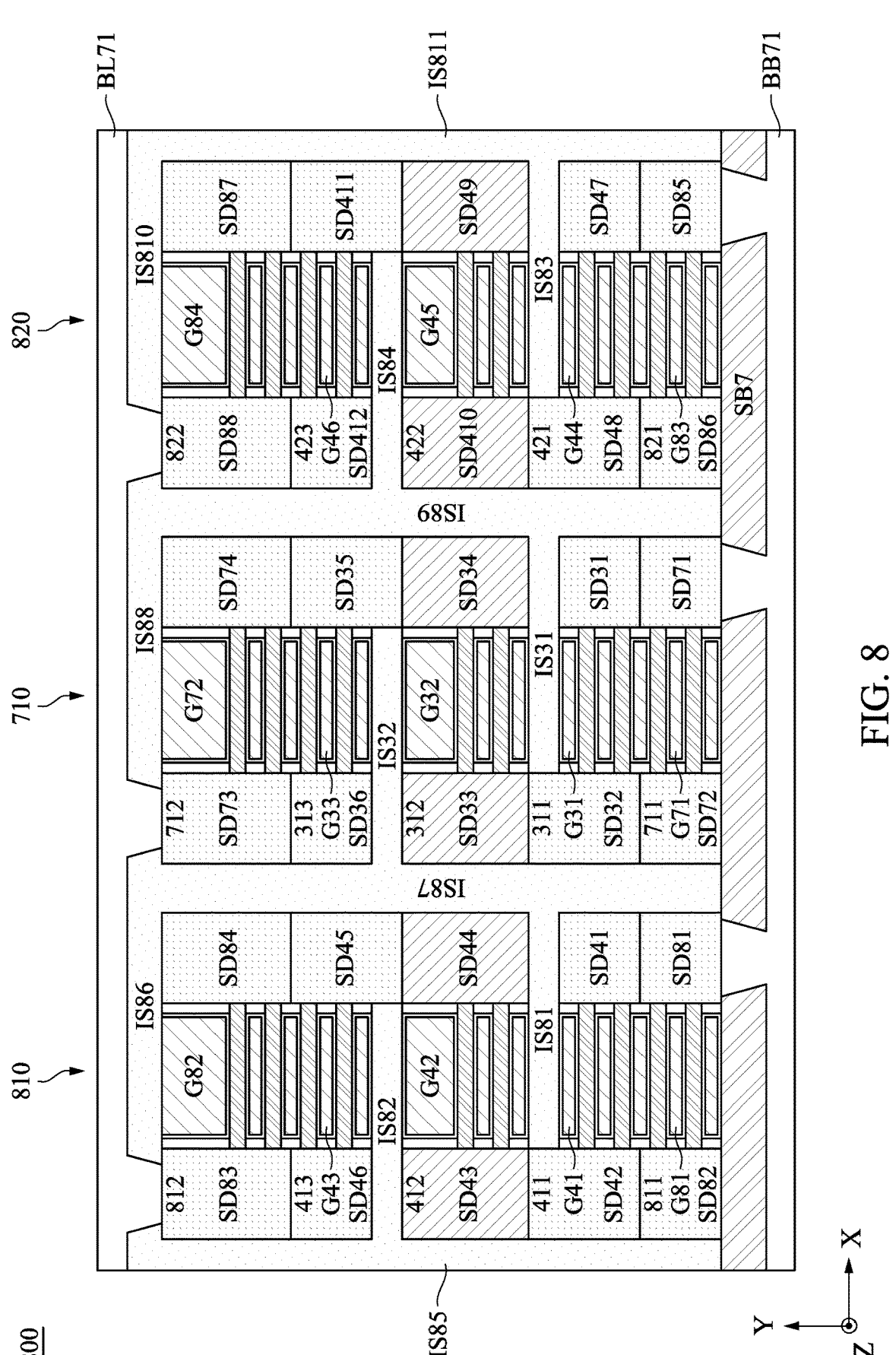
FIG. 8 is a cross section diagram of a semiconductor device corresponding to the semiconductor device shown in FIG. 7, in accordance with some embodiments of the present disclosure.

FIG. 8 is a cross section diagram of a semiconductor device 800 corresponding to the semiconductor device 700 shown in FIG. 7, in accordance with some embodiments of the present disclosure. Referring to FIG. 7 and FIG. 8, the semiconductor device 800 is an alternative embodiment of the semiconductor device 700. FIG. 8 follows a similar labeling convention to that of FIG. 7. For brevity, the discussion will focus more on differences between FIG. 7 and FIG. 8 than on similarities.

Referring to FIG. 7 and FIG. 8, compared to the semiconductor device 700, the semiconductor device 800 further includes transistor cells 810, 820 and isolation structures IS81-IS811. Referring to FIG. 4 and FIG. 8, the transistor cells 710, 810, 820 and the isolation structures IS81-IS811 are alternative embodiments of the transistor cells 310, 410, 420 and the isolation structures IS41-IS411, respectively. Therefore, some descriptions are not repeated for brevity.

Referring to FIG. 4 and FIG. 8, compared to the transistor cell 410, the transistor cell 810 further includes transistor cell 811 and 812. The transistor cell 811 is formed above the substrate SB7. The transistor cell 411 is stacked on the transistor cell 811. The transistor cell 812 is stacked on the transistor cell 413.

Similarly, compared to the transistor cell 420, the transistor cell 820 further includes transistor cell 821 and 822. The transistor cell 821 is formed above the substrate SB7. The transistor cell 421 is stacked on the transistor cell 821. The transistor cell 822 is stacked on the transistor cell 423.

As illustratively shown in FIG. 8, the transistor 811 includes source/drain structures SD81, SD82 and a gate structure G81. The transistor 812 includes source/drain structures SD83, SD84 and a gate structure G82. The source/drain structures SD81-SD84 are coupled to the source/drain structures SD41, SD42, SD46 and SD45, respectively. Accordingly, the transistors 411 and 811 are coupled in parallel with each other, and the transistors 413 and 812 are coupled in parallel with each other.

Similarly, the transistor 821 includes source/drain structures SD85, SD86 and a gate structure G83. The transistor 822 includes source/drain structures SD87, SD88 and a gate structure G84. The source/drain structures SD85-SD88 are coupled to the source/drain structures SD47, SD48, SD411 and SD412, respectively. Accordingly, the transistors 421 and 821 are coupled in parallel with each other, and the transistors 423 and 822 are coupled in parallel with each other.

As illustratively shown in FIG. 8, the isolation structure IS86 is configured to isolate the gate structure G82 and the source/drain structure SD84 from the bit line BL71. The isolation structure IS87 is configured to isolate the source/drain structures SD81, SD41. SD44, SD45 and SD84 from the source/drain structures SD72, SD32, SD33, SD36 and SD73. The isolation structure IS88 is configured to isolate the gate structure G72 and the source/drain structure SD74 from the bit line BL71. The isolation structure IS89 is configured to isolate the source/drain structures SD71, SD31, SD34, SD35 and SD74 from the source/drain structures SD86, SD48, SD410, SD412 and SD88. The isolation structure IS810 is configured to isolate the gate structure G84 and the source/drain structure SD87 from the bit line BL71. The isolation structure IS85 is configured to isolate the transistor cell 810 from other transistor cells (not shown in figures). The isolation structure IS811 is configured to isolate the transistor cell 820 from other transistor cells (not shown in figures).

Referring to FIG. 2 and FIG. 8, in some embodiments, the transistor cell 200 is implemented by the transistor cell 810. In such embodiments, the transistor T21 corresponds to the transistors 413 and 812, and the transistor T22 corresponds to the transistors 411 and 811. Each of the gate structures G41-G43 and G81-G82 is configured to receive the word line signal W1M. The current signal IB1N is transmitted from the source/drain structure SD43 through the transistors 411 and 811 to the bit line BB71, and the current signal IL1N is transmitted from the source/drain structure SD44 through the transistors 413 and 812 to the bit line BL71.

Similarly, in some embodiments, the transistor cell 200 is implemented by the transistor cell 820. In such embodiments, the transistor T21 corresponds to the transistors 423 and 822, and the transistor T22 corresponds to the transistors 421 and 821. Each of the gate structures G44-G46 and G83-G84 is configured to receive the word line signal W1M. The current signal IB1N is transmitted from the source/drain structure SD410 through the transistors 421 and 821 to the bit line BB71, and the current signal IL1N is transmitted from the source/drain structure SD49 through the transistors 423 and 822 to the bit line BL71.

Figure 9:
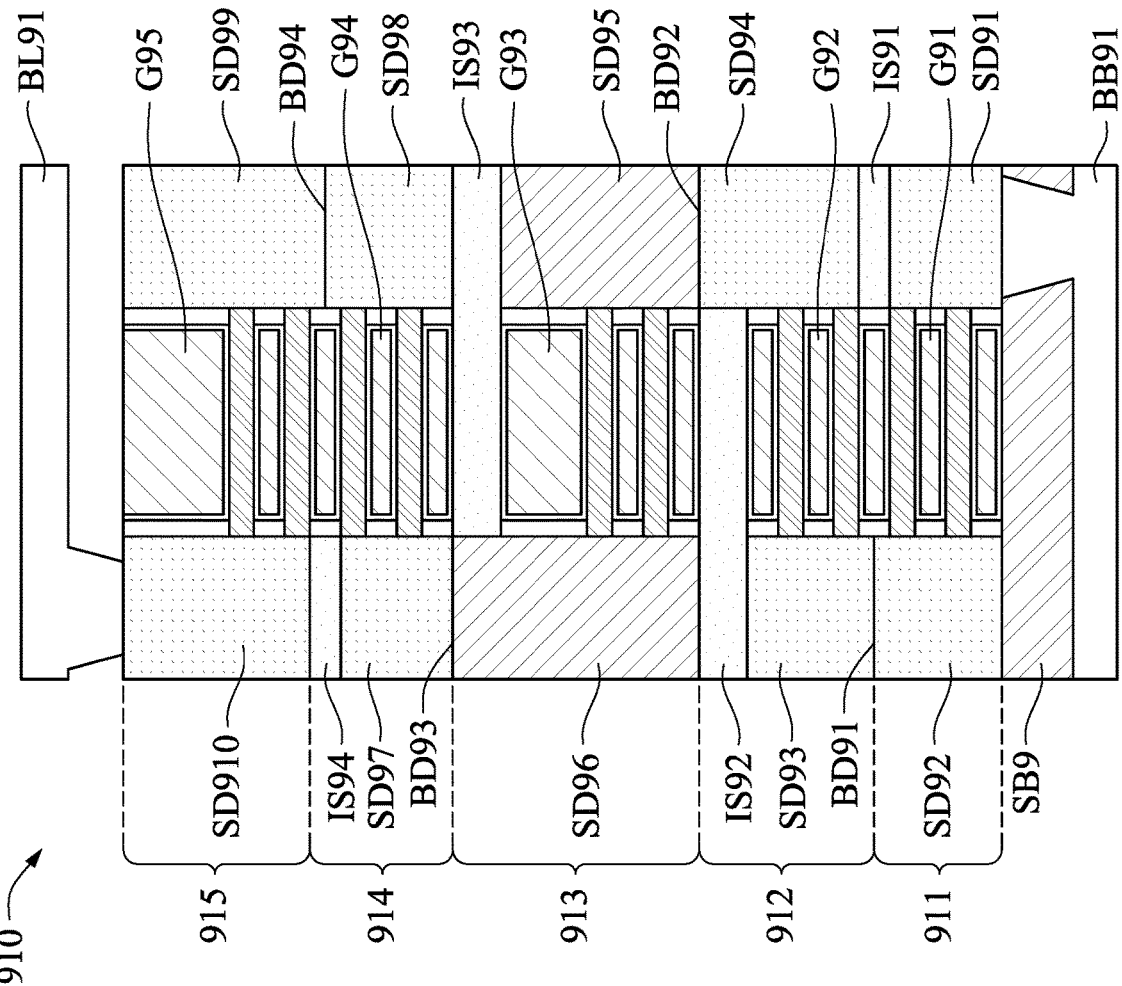
FIG. 9 is a cross section diagram of a semiconductor device corresponding to the semiconductor device shown in FIG. 3A, in accordance with some embodiments of the present disclosure.

FIG. 9 is a cross section diagram of a semiconductor device 900 corresponding to the semiconductor device 300 shown in FIG. 3A, in accordance with some embodiments of the present disclosure. The Z direction points out from the paper in FIG. 9.

As illustratively shown in FIG. 9, the semiconductor device 900 includes a transistor cell 910, bit lines BB91, BL91, a substrate SB9 and isolation structures IS91-IS94. The transistor cell 910 includes transistors 911-915. The transistors 911-915 are stacked in order along the Y direction. The transistors 911 and 912 are coupled in series between the bit line BB91 and the transistor 913. The transistors 914 and 915 are coupled in series between the bit line BL91 and the transistor 913.

As illustratively shown in FIG. 3A, the transistor 911 includes source/drain structures SD91, SD92 and a gate structure G91. The transistor 912 includes source/drain structures SD93, SD94 and a gate structure G92. The transistor 913 includes source/drain structures SD95, SD96 and a gate structure G93. The transistor 914 includes source/drain structures SD97, SD98 and a gate structure G94. The transistor 915 includes source/drain structures SD99, SD910 and a gate structure G95.

As illustratively shown in FIG. 9, the bit line BB91 extends along the X direction. The substrate SB9 is formed above the bit line BB91. A portion of the bit line BB91 extends through the substrate SB9 along the Y direction to be coupled with the source/drain structure SD91. The bit line BL91 extends along the X direction and is coupled to the source/drain structure SD910.

As illustratively shown in FIG. 9, each of the source/drain structures SD91, SD92 and the gate structure G91 is formed above the substrate SB9. The source/drain structure SD92, the gate structure G91 and the source/drain structure SD91 are arranged in order along the X direction. Each of the source/drain structures SD93, SD94 and the gate structure G92 is formed above the transistor 911. The source/drain structure SD93, the gate structure G92 and the source/drain structure SD94 are arranged in order along the X direction.

As illustratively shown in FIG. 9, the isolation structure IS91 is formed between the source/drain structures SD91 and SD94 to isolate the source/drain structures SD91 and SD94 from each other. The source/drain structures SD92 and SD93 are coupled to each other. In some embodiments, the source/drain structures SD92 and SD93 contact with each other to form a boundary BD91.

As illustratively shown in FIG. 9, each of the source/drain structures SD95, SD96 and the gate structure G93 is formed above the transistor 912. The source/drain structure SD96, the gate structure G93 and the source/drain structure SD95 are arranged in order along the X direction.

As illustratively shown in FIG. 9, the isolation structure IS92 is formed between the source/drain structures SD93 and SD96 to isolate the source/drain structures SD93 and SD96 from each other, and is formed between the gate structures G92 and G93 to isolate the gate structures G92 and G93 from each other. The source/drain structures SD94 and SD95 are coupled to each other. In some embodiments, the source/drain structures SD94 and SD95 contact with each other to form a boundary BD92.

As illustratively shown in FIG. 9, each of the source/drain structures SD97, SD98 and the gate structure G94 is formed above the transistor 913. The source/drain structure SD97, the gate structure G94 and the source/drain structure SD98 are arranged in order along the X direction.

As illustratively shown in FIG. 9, the isolation structure IS93 is formed between the source/drain structures SD98 and SD95 to isolate the source/drain structures SD98 and SD95 from each other, and is formed between the gate structures G94 and G93 to isolate the gate structures G94 and G93 from each other. The source/drain structures SD96 and SD97 are coupled to each other. In some embodiments, the source/drain structures SD96 and SD97 contact with each other to form a boundary BD93.

As illustratively shown in FIG. 9, each of the source/drain structures SD910, SD99 and the gate structure G95 is formed above the transistor 914. The source/drain structure SD910, the gate structure G95 and the source/drain structure SD99 are arranged in order along the X direction.

As illustratively shown in FIG. 9, the isolation structure IS94 is formed between the source/drain structures SD97 and SD910 to isolate the source/drain structures SD97 and SD910 from each other. The source/drain structures SD98 and SD99 are coupled to each other. In some embodiments, the source/drain structures SD98 and SD99 contact with each other to form a boundary BD94.

Referring to FIG. 3A and FIG. 9, the transistor cell 910 is an alternative embodiment of the transistor cell 310. The bit lines BL91, BB91, transistors 912-914, source/drain structures SD93-SD98, the gate structures G92-G94 and the isolation structures IS92-IS93 correspond to the bit lines BL31, BB31, transistors 311-313, source/drain structures SD31-SD36, the gate structures G31-G33 and the isolation structures IS31-IS32, respectively. Features of the boundaries BD91-BD94 are similar with the features of the boundaries BD31-BD32. Therefore, some descriptions are not repeated for brevity.

Referring to FIG. 2 and FIG. 9, in some embodiments, the transistor cell 200 is implemented by the transistor cell 910. In such embodiments, the transistor T21 corresponds to the transistors 914 and 915, and the transistor T22 corresponds to the transistors 911 and 912. The gate structure G93 and the source/drain structures SD95, SD96 correspond to the gate structure G21 and the source/drain structures SD22, SD21, respectively.

In the embodiments described above, the bit lines BB91 and BL91 are configured to receive the bit line signals BB1N and BL1N, respectively. Each of the gate structures G91, G92, G94 and G95 is configured to receive the word line signal W1M. The source/drain structure SD95 is configured to receive the voltage signal SL11 to generate the current signal IB1N flowing through the boundary BD92, the source/drain structures SD94, SD93, the boundary BD91 and the source/drain structures SD92, SD91 in order, to the bit line BB91. The source/drain structure SD96 is configured to receive the voltage signal SL11 to generate the current signal IL1N flowing through the boundary BD93, the source/drain structures SD97, SD98, the boundary BD94 and the source/drain structures SD99, SD910 in order, to the bit line BL91.

In the embodiments described above, in response to variations of the boundaries BD91-BD92, randomness of resistances between the bit line BB91 and the source/drain structures SD95 is increased. In response to variations of the boundaries BD93-BD94, randomness of resistances between the bit line BL91 and the source/drain structures SD96 is increased. Accordingly, the randomness of the current levels of the current signals IL1N and IB1N are increased.

Figure 10:
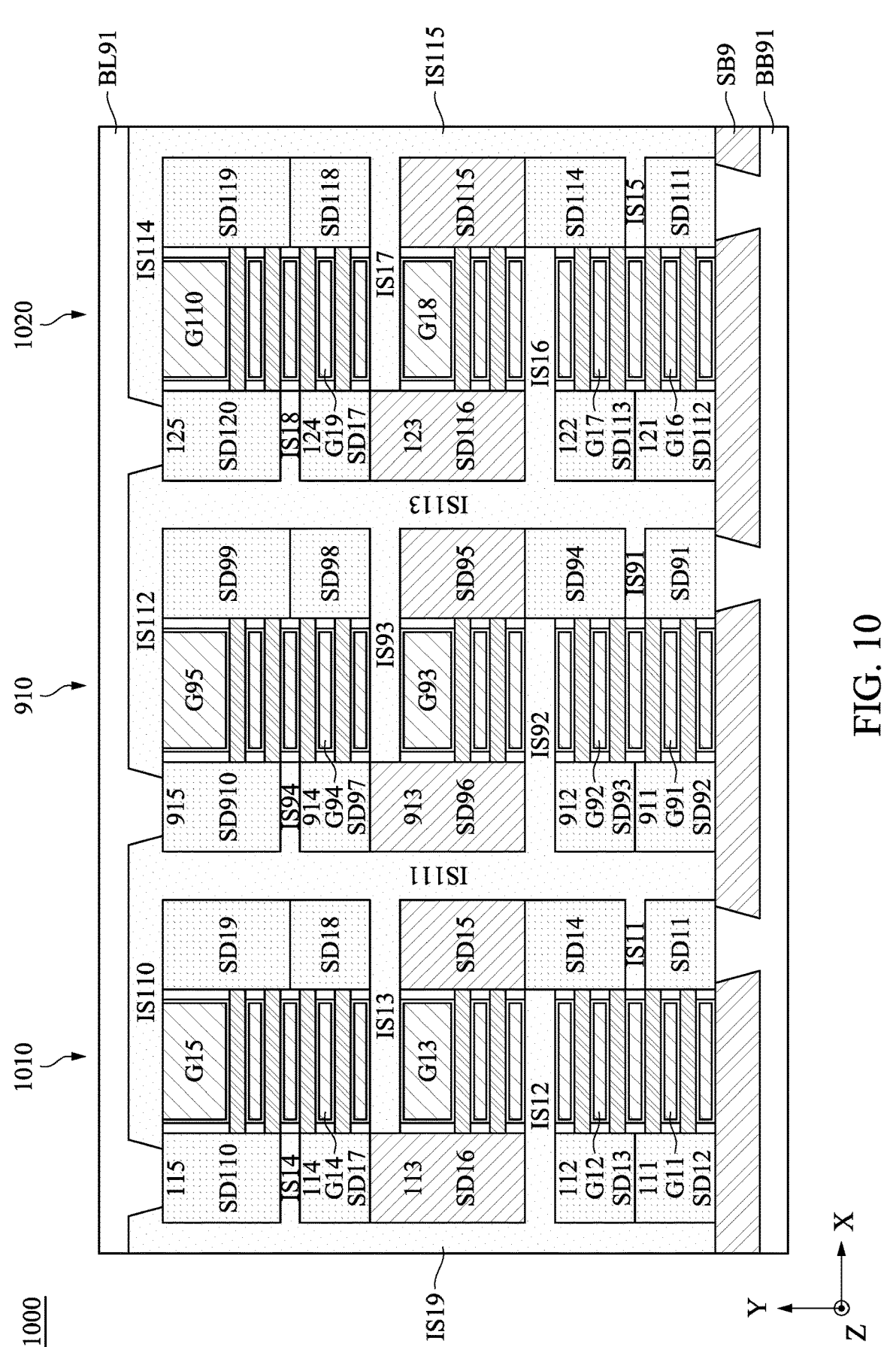
FIG. 10 is a cross section diagram of a semiconductor device corresponding to the semiconductor device shown in FIG. 9, in accordance with some embodiments of the present disclosure.

FIG. 10 is a cross section diagram of a semiconductor device 1000 corresponding to the semiconductor device 900 shown in FIG. 9, in accordance with some embodiments of the present disclosure. Referring to FIG. 9 and FIG. 10, the semiconductor device 1000 is an alternative embodiment of the semiconductor device 900. FIG. 10 follows a similar labeling convention to that of FIG. 9. For brevity, the discussion will focus more on differences between FIG. 9 and FIG. 10 than on similarities.

Referring to FIG. 9 and FIG. 10, compared to the semiconductor device 900, the semiconductor device 1000 further includes transistor cells 1010, 1020 and isolation structures IS11-IS115. The transistor cells 1010, 910 and 1020 are arranged in order along the X direction. The transistor cell 1010 includes transistors 111-115. The transistors 111-115 are stacked in order along the Y direction. The transistor cell 1020 includes transistors 121-125. The transistors 121-125 are stacked in order along the Y direction.

As illustratively shown in FIG. 10, the transistor 111 includes source/drain structures SD11, SD12 and a gate structure G11. The transistor 112 includes source/drain structures SD13, SD14 and a gate structure G12. The transistor 113 includes source/drain structures SD15, SD16 and a gate structure G13. The transistor 114 includes source/drain structures SD17, SD18 and a gate structure G14. The transistor 115 includes source/drain structures SD19, SD110 and a gate structure G15.

Referring to FIG. 9 and FIG. 10, configurations of the transistor cell 1010 is similar to the configurations of the transistor cell 910. The transistor cells 111-115, the isolation structures IS11-IS14, the source/drain structures SD11-SD110 and the gate structures G11-G15 correspond to the transistor cells 911-915, the isolation structures IS91-IS94, the source/drain structures SD91-SD910 and the gate structures G91-G95, respectively. Therefore some descriptions are not repeated for brevity.

As illustratively shown in FIG. 10, the transistor 121 includes source/drain structures SD111, SD112 and a gate structure G16. The transistor 122 includes source/drain structures SD113, SD114 and a gate structure G17. The transistor 123 includes source/drain structures SD115, SD116 and a gate structure G18. The transistor 124 includes source/drain structures SD117, SD118 and a gate structure G19. The transistor 125 includes source/drain structures SD119, SD120 and a gate structure G110.

Referring to FIG. 9 and FIG. 10, configurations of the transistor cell 1020 is similar to the configurations of the transistor cell 910. The transistor cells 121-125, the isolation structures IS15-IS18, the source/drain structures SD111-SD120 and the gate structures G16-G110 correspond to the transistor cells 911-915, the isolation structures IS91-IS94, the source/drain structures SD91-SD910 and the gate structures G91-G95, respectively. Therefore some descriptions are not repeated for brevity.

As illustratively shown in FIG. 10, the isolation structure IS110 is configured to isolate the gate structure G15 and the source/drain structure SD19 from the bit line BL91. The isolation structure IS111 is configured to isolate the source/drain structures SD11, SD14, SD15, SD18 and SD19 from the source/drain structures SD92, SD93, SD96, SD97 and SD910. The isolation structure IS112 is configured to isolate the gate structure G95 and the source/drain structure SD99 from the bit line BL91. The isolation structure IS113 is configured to isolate the source/drain structures SD91, SD94, SD95, SD98 and SD99 from the source/drain structures SD112, SD113, SD116, SD117 and SD120. The isolation structure IS114 is configured to isolate the gate structure G110 and the source/drain structure SD119 from the bit line BL91. The isolation structure IS19 is configured to isolate the transistor cell 1010 from other transistor cells (not shown in figures). The isolation structure IS115 is configured to isolate the transistor cell 1020 from other transistor cells (not shown in figures).

Referring to FIG. 2 and FIG. 10, in some embodiments, the transistor cell 200 is implemented by the transistor cell 1010. In such embodiments, the transistor T21 corresponds to the transistors 114 and 115, and the transistor T22 corresponds to the transistors 111 and 112. Each of the gate structures G11-G15 is configured to receive the word line signal W1M. The source/drain structure SD11 is configured to receive the bit line signal BB1N from the bit line BB91. The source/drain structure SD110 is configured to receive the bit line signal BL1N from the bit line BL91. Each of the source/drain structures SD15 and SD16 is configured to receive the voltage signal SL11.

In the embodiments described above, the current signal IB1N is transmitted from the source/drain structure SD15 through the source/drain structures SD14, SD13, SD12 and SD11 in order, to the bit line BB91. The current signal IL1N is transmitted from the source/drain structure SD16 through the source/drain structures SD17. SD18, SD19 and SD110 in order, to the bit line BL91.

Referring to FIG. 2 and FIG. 10, in some embodiments, the transistor cell 200 is implemented by the transistor cell 1020. In such embodiments, the transistor T21 corresponds to the transistors 124 and 125, and the transistor T22 corresponds to the transistors 121 and 122. Each of the gate structures G16-G110 is configured to receive the word line signal W1M. The source/drain structure SD111 is configured to receive the bit line signal BB1N from the bit line BB91. The source/drain structure SD120 is configured to receive the bit line signal BL1N from the bit line BL91. Each of the source/drain structures SD115 and SD116 is configured to receive the voltage signal SL11.

In the embodiments described above, the current signal IB1N is transmitted from the source/drain structure SD115 through the source/drain structures SD114, SD113, SD112 and SD111 in order, to the bit line BB91. The current signal IL1N is transmitted from the source/drain structure SD116 through the source/drain structures SD117, SD118, SD119 and SD120 in order, to the bit line BL91.

Also disclosed is a semiconductor device. The semiconductor device includes a first transistor cell. The first transistor cell is configured to generate a first current signal and a second current signal indicating a bit of a physical unclonable function. The first transistor cell includes a first transistor, a second transistor and a third transistor. The first transistor is configured to output the first current signal. The second transistor is configured to generate the first current signal from a first source/drain structure of the second transistor, and generate the second current signal from a second source/drain structure of the second transistor. The third transistor is configured to output the second current signal. The first transistor, the second transistor and the third transistor are stacked in order along a first direction. The first source/drain structure of the second transistor and the second source/drain structure of the second transistor are arranged along a second direction different from the first direction.

Also disclosed is a semiconductor device. The semiconductor device includes a first source/drain structure, a second source/drain structure, a third source/drain structure and a comparator. The second source/drain structure contacts with the first source/drain structure to form a first boundary, and is configured to generate a first current signal flowing through the first boundary according to a voltage signal. The third source/drain structure is configured to generate a second current signal according to the voltage signal. The comparator is configured to compare the first current signal and the second current signal to generate a bit of a physical unclonable function. The second source/drain structure and the third source/drain structure correspond to two terminals of a first transistor, respectively. The first source/drain structure and the second source/drain structure are arranged in order along a first direction. The second source/drain structure and the third source/drain structure are arranged in order along a second direction different from the first direction.

Also disclosed is a method. The method includes: forming a first transistor stacked on a second transistor along a first direction; and forming a third transistor stacked on the first transistor along the first direction. The first transistor is configured to generate a first current signal and a second current signal indicating a bit of a physical unclonable function. The first current signal flows from a first terminal of the first transistor through the second transistor to a first bit line. The second current signal flows from a second terminal of the first transistor through the third transistor to a second bit line. Each of the first transistor, the second transistor and the third transistor is formed between the first bit line and the second bit line. Each of the first bit line and the second bit line extends along a second direction different from the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising a first transistor cell configured to generate a first current signal and a second current signal indicating a bit of a physical unclonable function, the first transistor cell comprising:

a first transistor configured to output the first current signal;

a second transistor configured to generate the first current signal from a first source/drain structure of the second transistor, and generate the second current signal from a second source/drain structure of the second transistor;

a third transistor configured to output the second current signal, wherein the first transistor, the second transistor and the third transistor are stacked in order along a first direction, and the first source/drain structure of the second transistor and the second source/drain structure of the second transistor are arranged along a second direction different from the first direction; and a first via extending along the first direction to couple a gate structure of the first transistor to a gate structure of the third transistor.

2. The semiconductor device of claim 1, wherein the first source/drain structure of the second transistor contacts with a first source/drain structure of the first transistor to form a first boundary, and the second transistor is configured to generate the first current signal according to a resistance of the first boundary.

3. The semiconductor device of claim 2, wherein the second source/drain structure of the second transistor contacts with a first source/drain structure of the third transistor to form a second boundary, and the second transistor is configured to generate the second current signal according to a resistance of the second boundary.

4. The semiconductor device of claim 1, further comprising:

an isolation structure formed between the first via and a gate structure of the second transistor, to isolate the first via from the gate structure of the second transistor.

5. The semiconductor device of claim 1, further comprising:

a second via extending along the first direction, and configured to provide a voltage signal to the first source/drain structure of the second transistor;

a first isolation structure formed between the second via and a first source/drain structure of the third transistor, to isolate the second via from the first source/drain structure of the third transistor;

a third via extending along the first direction, and configured to provide the voltage signal to the second source/drain structure of the second transistor; and a second isolation structure formed between the third via and a second source/drain structure of the third transistor, to isolate the third via from the second source/drain structure of the third transistor.

6. The semiconductor device of claim 1, further comprising a second transistor cell configured to generate the first current signal and the second current signal, the second transistor cell comprising:

a fourth transistor configured to output the first current signal;

a fifth transistor configured to generate the first current signal from a first source/drain structure of the fifth transistor, and generate the second current signal from a second source/drain structure of the fifth transistor; and a sixth transistor configured to output the second current signal, wherein the fourth transistor, the fifth transistor and the sixth transistor are stacked in order along the first direction, and the first source/drain structure of the second transistor, the second source/drain structure of the second transistor, the first source/drain structure of the fifth transistor and the second source/drain structure of the fifth transistor are arranged in order along the second direction.

7. The semiconductor device of claim 6, further comprising a third transistor cell configured to generate the first current signal and the second current signal, the third transistor cell comprising:

a seventh transistor configured to output the first current signal;

an eighth transistor configured to generate the first current signal from a first source/drain structure of the eighth transistor, and generate the second current signal from a second source/drain structure of the eighth transistor; and a ninth transistor configured to output the second current signal, wherein the seventh transistor, the eighth transistor and the ninth transistor are stacked in order along the first direction, and the first source/drain structure of the eighth transistor, the second source/drain structure of the eighth transistor, the first source/drain structure of the second transistor and the second source/drain structure of the second transistor are arranged in order along the second direction.

8. The semiconductor device of claim 1, further comprising:

a fourth transistor coupled in parallel with the third transistor, and configured to output the second current signal with the third transistor, wherein the second transistor, the third transistor and the fourth transistor are stacked in order along the first direction.

9. The semiconductor device of claim 1, further comprising:

a fourth transistor coupled in series with the third transistor, and configured to receive the second current signal from the third transistor, to output the second current signal, wherein the second transistor, the third transistor and the fourth transistor are stacked in order along the first direction.

10. The semiconductor device of claim 9, wherein a first source/drain structure of the third transistor contacts with a first source/drain structure of the fourth transistor to form a boundary, and the second transistor is configured to generate the second current signal according to a resistance of the boundary.

11. A semiconductor device, comprising:

a first source/drain structure;

a second source/drain structure contacting with the first source/drain structure to form a first boundary, and configured to generate a first current signal flowing through the first boundary according to a voltage signal;

a third source/drain structure configured to generate a second current signal according to the voltage signal;

a comparator configured to compare the first current signal and the second current signal to generate a bit of a physical unclonable function;

a first bit line configured to receive the first current signal; and a second bit line configured to receive the second current signal, wherein the second source/drain structure and the third source/drain structure correspond to two terminals of a first transistor, respectively, the first source/drain structure and the second source/drain structure are arranged in order along a first direction, the second source/drain structure and the third source/drain structure are arranged in order along a second direction different from the first direction, and the first transistor is formed between the first bit line and the second bit line.

12. The semiconductor device of claim 11, further comprising:

a fourth source/drain structure contacting with the third source/drain structure to form a second boundary, wherein the third source/drain structure is further configured to generate the second current signal flowing through the second boundary, and the third source/drain structure and the fourth source/drain structure are arranged in order along the second direction.

13. The semiconductor device of claim 12, further comprising:

a fifth source/drain structure configured to transmit the first current signal from the first source/drain structure to the comparator, wherein the first source/drain structure and the fifth source/drain structure correspond to two terminals of a second transistor, respectively, and the fifth source/drain structure and the third source/drain structure are arranged in order along the first direction.

14. The semiconductor device of claim 13, further comprising:

a sixth source/drain structure configured to transmit the second current signal from the fourth source/drain structure to the comparator, wherein the fourth source/drain structure and the sixth source/drain structure correspond to two terminals of a third transistor, respectively, and the second source/drain structure and the sixth source/drain structure are arranged in order along the first direction.

15. The semiconductor device of claim 13, further comprising:

a sixth source/drain structure contacting with the fifth source/drain structure to form a third boundary, wherein the first current signal flows through the fifth source/drain structure, the third boundary and the sixth source/drain structure in order, to the comparator, and the sixth source/drain structure and the fifth source/drain structure are arranged in order along the first direction.

16. The semiconductor device of claim 15, further comprising:

a seventh source/drain structure configured to transmit the first current signal from the sixth source/drain structure to the comparator, wherein the seventh source/drain structure and the sixth source/drain structure correspond to two terminals of a third transistor, respectively, and the seventh source/drain structure and the first source/drain structure are arranged in order along the first direction.

17. A method, comprising:

forming a first transistor stacked on a second transistor along a first direction; and forming a third transistor stacked on the first transistor along the first direction, wherein the first transistor is configured to generate a first current signal and a second current signal indicating a bit of a physical unclonable function, the first current signal flows from a first terminal of the first transistor through the second transistor to a first bit line, the second current signal flows from a second terminal of the first transistor through the third transistor to a second bit line, each of the first transistor, the second transistor and the third transistor is formed between the first bit line and the second bit line, and each of the first bit line and the second bit line extends along a second direction different from the first direction.

18. The method of claim 17, wherein forming the first transistor comprises:

forming a first source/drain structure of the first transistor contacting with a first source/drain structure of the second transistor, wherein a current level of the first current signal is increased when a resistance of a first boundary between the first source/drain structure of the first transistor and the first source/drain structure of the second transistor is decreased.

19. The method of claim 18, wherein forming the third transistor comprises:

forming a first source/drain structure of the third transistor contacting with a second source/drain structure of the first transistor, wherein the current level of the second current signal is increased when a resistance of a second boundary between the first source/drain structure of the third transistor and the second source/drain structure of the first transistor is decreased.

20. The method of claim 19, further comprising:

forming a fourth transistor stacked on the third transistor along the first direction, comprising:

forming a first source/drain structure of the fourth transistor contacting with a second source/drain structure of the first transistor, wherein the current level of the second current signal is increased when a resistance of a third boundary between the first source/drain structure of the fourth transistor and the second source/drain structure of the first transistor is decreased, and the second current signal flows from the second source/drain structure of the first transistor, through the second boundary and the third boundary in order, to the second bit line.

\* \* \* \* \*